United States Patent
Xie et al.

(10) Patent No.: US 11,676,524 B2
(45) Date of Patent: Jun. 13, 2023

(54) SHIFT REGISTER, GATE DRIVING CIRCUIT AND DISPLAY PANEL

(71) Applicants: Hefei Xinsheng Optoelectronics Technology Co., Ltd., Anhui (CN); BOE TECHNOLOGY GROUP CO., LTD., Beijing (CN)

(72) Inventors: Yongxian Xie, Beijing (CN); Tong Yang, Beijing (CN); Feng Qu, Beijing (CN); Fengzhen Lv, Beijing (CN); Xianjie Shao, Beijing (CN); Rui Ma, Beijing (CN); Rui Li, Beijing (CN)

(73) Assignees: Hefei Xinsheng Optoelectronics Technology Co., Ltd., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/789,607

(22) PCT Filed: Sep. 15, 2021

(86) PCT No.: PCT/CN2021/118407
§ 371 (c)(1),
(2) Date: Jun. 28, 2022

(87) PCT Pub. No.: WO2022/089070
PCT Pub. Date: May 5, 2022

(65) Prior Publication Data
US 2023/0043196 A1    Feb. 9, 2023

(30) Foreign Application Priority Data
Oct. 28, 2020    (CN) .......................... 202011169460.9

(51) Int. Cl.
*G09G 3/20* (2006.01)
*G11C 19/28* (2006.01)

(52) U.S. Cl.
CPC ............. *G09G 3/20* (2013.01); *G11C 19/287* (2013.01); *G09G 2300/0408* (2013.01); *G09G 2300/0842* (2013.01); *G09G 2310/0286* (2013.01)

(58) Field of Classification Search
CPC ............. G09G 3/20; G09G 2300/0408; G09G 2300/0842; G09G 2310/0286; G11C 19/287
See application file for complete search history.

(56) References Cited

U.S. PATENT DOCUMENTS

2020/0211473 A1* 7/2020 Kim .................. H10K 59/32
2020/0214127 A1* 7/2020 Choi ................. H05K 3/361

FOREIGN PATENT DOCUMENTS

| CN | 104575429 A | 4/2015 |
|---|---|---|
| CN | 107657983 A | 2/2018 |

(Continued)

OTHER PUBLICATIONS

China Patent Office, First Office Action dated Nov. 4, 2021 for application No. CN202011169460.9.

(Continued)

*Primary Examiner* — Sejoon Ahn
(74) *Attorney, Agent, or Firm* — Houtteman Law LLC

(57) ABSTRACT

The present disclosure provides a shift register, a gate driving circuit and a display panel, and belongs to the field of display technology. The shift register of the present disclosure includes: an input circuit configured to precharge and reset a pull-up node; one pull-down control circuit being electrically connected to one pull-down circuit through a pull-down node; the pull-down control circuit being configured to control a potential at the pull-down node under a first power voltage; each pull-down circuit being configured to pull down the potential at the pull-down node in response to a potential at the pull-up node; an output circuit configured (Continued)

to output a clock signal through a signal output terminal in response to the potential at the pull-up node; one first noise reduction circuit connected to one pull-down node.

20 Claims, 12 Drawing Sheets

(56) References Cited

FOREIGN PATENT DOCUMENTS

| | | |
|---|---|---|
| CN | 108281123 A | 7/2018 |
| CN | 110517622 A | 11/2019 |
| CN | 111210789 A | 5/2020 |
| CN | 112164365 A | 1/2021 |

OTHER PUBLICATIONS

China Patent Office, Second Office Action dated Jun. 28, 2022 for application No. CN202011169460.9.
China Patent Office, Decision of rejection dated Nov. 11, 2022 for application No. CN202011169460.9.

* cited by examiner

SHIFT REGISTER, GATE DRIVING CIRCUIT AND DISPLAY PANEL

TECHNICAL FIELD

The present disclosure relates to the field of display technology, and in particular to a shift register, a gate driving circuit and a display panel.

BACKGROUND

In the gate driver on array (GOA) technology, a gate driving circuit may be integrated on an array substrate of a display panel to replace a driver chip made of an external silicon chip, which may omit a gate integrated circuit (gate IC) part and save a fan-out wiring space, thereby simplifying a structure of the display product.

SUMMARY

The present disclosure is directed to at least solve one of the technical problems in the related art, and provides a shift register, a gate driving circuit and a display panel.

In a first aspect, an embodiment of the present disclosure provides a shift register, including: an input circuit, an output circuit, at least one pull-down control circuit, at least one pull-down circuit, at least one first auxiliary circuit and at least one first noise reduction circuit; wherein,
the input circuit is configured to precharge and reset a pull-up node; the input circuit, the pull-down circuit and the output circuit are connected to the pull-up node as a connection node;
one of the at least one pull-down control circuit is electrically connected to one of the at least one pull-down circuit through a pull-down node; the at least one pull-down control circuit is configured to control a potential at the pull-down node under the control of a first power voltage;
each of the at least one pull-down circuit is configured to pull down the potential at the pull-down node in response to a potential at the pull-up node;
the output circuit is configured to output a clock signal through a signal output terminal in response to the potential at the pull-up node;
one of the at least one first noise reduction circuit is connected to one pull-down node;
the at least one first noise reduction circuit is configured to denoise the pull-up node and an output of the signal output terminal by a non-operating level signal in response to the pull-down node; and
one of the at least one first auxiliary circuit is electrically connected to one pull-down node; the at least one first auxiliary circuit is configured to pull down a potential at the pull-down node by a non-operating level signal in a precharge stage in response to an input signal.

In some embodiments, the input circuit includes a first input sub-circuit and a second input sub-circuit;
the first input sub-circuit is configured to charge the pull-up node by a first voltage in response to a first input signal in a forward scanning, and reset the pull-up node by a second voltage in response to a second input signal in a reverse scanning; and
the second input sub-circuit is configured to reset the pull-up node by the second voltage in response to the second input signal in the forward scanning, and charge the pull-up node by the first voltage in response to the first input signal in the reverse scanning.

In some embodiments, the first input sub-circuit includes a first transistor; the second input sub-circuit includes a second transistor;
a first electrode of the first transistor is connected to a first voltage terminal, a second electrode of the first transistor is connected to the pull-up node, and a control electrode of the first transistor is connected to a first input signal terminal; and
a first electrode of the second transistor is connected to a second voltage terminal, a second electrode of the second transistor is connected to the pull-up node, and a control electrode of the second transistor is connected to a second input signal terminal.

In some embodiments, the input circuit further includes a first anticreep sub-circuit and a second anticreep sub-circuit; the first anticreep sub-circuit is configured to prevent the first input sub-circuit from leaking electricity to affect the potential at the pull-up node in the forward scanning; and the second anticreep sub-circuit is configured to prevent the second input sub-circuit from leaking electricity to affect the potential at the pull-up node in the reverse scanning.

In some embodiments, the first anticreep sub-circuit includes a twelfth transistor;
the second anticreep sub-circuit includes a thirteenth transistor;
a first electrode of the twelfth transistor is connected to the first voltage terminal, a second electrode of the twelfth transistor is connected to the first input sub-circuit, and a control electrode of the twelfth transistor is connected to the first input signal terminal; and
a first electrode of the thirteenth transistor is connected to the second voltage terminal, a second electrode of the thirteenth transistor is connected to the second input sub-circuit, and a control electrode of the thirteenth transistor is connected to the second input signal terminal.

In some embodiments, the shift register further includes at least one second noise reduction circuit and at least one third noise reduction circuit;
one of the at least one second noise reduction circuit is connected to one pull-down node and is configured to denoise an output of the first anticreep sub-circuit in response to a potential at the pull-down node; and
one of the at least one third noise reduction circuit is connected to one pull-down node and is configured to denoise an output of the second anticreep sub-circuit in response to a potential at the pull-down node.

In some embodiments, the at least one second noise reduction circuit includes an eighteenth transistor; the at least one third noise reduction circuit includes a nineteenth transistor;
a first electrode of the eighteenth transistor is connected between the first input sub-circuit and the first anticreep sub-circuit, a second electrode of the eighteenth transistor is connected to a non-operating level terminal, and a control electrode of the eighteenth transistor is connected to a corresponding pull-down node; and
a first electrode of the nineteenth transistor is connected between the second input sub-circuit and the second anticreep sub-circuit, a second electrode of the nineteenth transistor is connected to the non-operating level terminal, and a control electrode of the nineteenth transistor are connected to a corresponding pull-down node.

In some embodiments, each of the at least one first auxiliary circuit includes a first auxiliary sub-circuit and a second auxiliary sub-circuit;

the first auxiliary sub-circuit is configured to pull down the potential at the pull-down node by the non-operating level signal in response to the first input signal in the forward scanning; and the second auxiliary sub-circuit is configured to pull down the potential at the pull-down node by the non-operating level signal in response to the first input signal in the reverse scanning.

In some embodiments, the first auxiliary sub-circuit includes a sixteenth transistor; the second auxiliary sub-circuit includes a seventeenth transistor;

a first electrode of the sixteenth transistor is connected to a corresponding pull-down node, a second electrode of the sixteenth transistor is connected to the non-operating level terminal, and a control electrode of the sixteenth transistor is connected to a first input signal terminal; and a first electrode of the seventeenth transistor is connected to a corresponding pull-down node, a second electrode of the seventeenth transistor is connected to the non-operating level terminal, and a control electrode of the seventeenth transistor is connected to a second input signal terminal.

In some embodiments, the shift register further includes a frame reset circuit configured to reset the potential at the pull-up node and the potential at the signal output terminal by the non-operating level signal in response to the reset signal in a blank stage.

In some embodiments, the frame reset circuit includes a fourth transistor and a seventh transistor;

a first electrode of the fourth transistor is connected to the signal output terminal, a second electrode of the fourth transistor is connected to a non-operating level terminal, and a control electrode of the fourth transistor is connected to the reset signal terminal; and a first electrode of the seventh transistor is connected to the pull-up node, a second electrode of the seventh transistor is connected to an operating level terminal, and a control electrode of the seventh transistor is connected to the reset signal terminal.

In some embodiments, each of the at least one first noise reduction circuit includes a tenth transistor and an eleventh transistor;

a first electrode of the tenth transistor is connected to the pull-up node, a second electrode of the tenth transistor is connected to a non-operating level terminal, and a control electrode of the tenth transistor is connected to the pull-down node; and a first electrode of the eleventh transistor is connected to the pull-up node, a second electrode of the eleventh transistor is connected to the signal output terminal, and a control electrode of the eleventh transistor is connected to the pull-down node.

In some embodiments, each pull-down control circuit includes a fifth transistor and a ninth transistor; each pull-down circuit includes a sixth transistor and an eighth transistor;

a first electrode of the fifth transistor is connected to a first power voltage terminal, a second electrode of the fifth transistor is connected to the pull-down node, and a control electrode of the fifth transistor is connected to a second electrode of the ninth transistor;

a first electrode and a control electrode of the ninth transistor are connected to the first power voltage terminal; and a first electrode of the sixth transistor is connected to the pull-down node, a second electrode of the sixth transistor is connected to a non-operating level terminal, and a control electrode of the sixth transistor is connected to the pull-down node; and a first electrode of the eighth transistor is connected to the second electrode of the ninth transistor and the control electrode of the fifth transistor, a second electrode of the eighth transistor is connected to the non-operating level terminal, and a control electrode of the eighth transistor is connected to the pull-up node.

In some embodiments, each pull-down control circuit includes a fifth transistor;

each pull-down circuit includes a sixth transistor;

a first electrode and a control electrode of the fifth transistor are connected to a first control signal terminal, a second electrode of the fifth transistor is connected to the pull-down node, and the first control signal terminal is configured to write a first power voltage into the control electrode of the fifth transistor in a display stage and write the non-operating level signal into the control electrode of the fifth transistor in a blank stage; and a first electrode of the sixth transistor is connected to the pull-down node, a second electrode of the sixth transistor is connected to a non-operating level terminal, and a control electrode of the sixth transistor is connected to the pull-up node.

In some embodiments, the shift register further includes a fourth noise reduction circuit configured to denoise an output of the signal output terminal by the non-operating level signal in response to a second control signal in the blank stage.

In some embodiments, the fourth noise reduction circuit includes a twentieth transistor; and a first electrode of the twentieth transistor is connected to the signal output terminal, a second electrode of the twentieth transistor is connected to the non-operating level terminal, and a control electrode of the twentieth transistor is connected to the second control signal terminal.

In some embodiments, the input circuit includes an input sub-circuit and a reset sub-circuit;

the input sub-circuit is configured to precharge the pull-up node by the input signal in response to the input signal; and the reset sub-circuit is configured to reset the pull-up node by the non-operating level signal in response to a reset signal.

In some embodiments, the input sub-circuit includes a first transistor, the reset sub-circuit includes a second transistor;

a first electrode and a control electrode of the first transistor are connected to the signal input terminal, and a second electrode of the first transistor is connected to the pull-up node; and a first electrode of the second transistor is connected to the pull-up node, a second electrode of the second transistor is connected to a non-operating level signal terminal, and a control electrode of the second transistor is connected to the reset signal terminal.

In some embodiments, the output circuit includes a third transistor and a storage capacitor;

a first electrode of the third transistor is connected to a clock signal terminal, a second electrode of the third transistor is connected to the signal output terminal, and a control electrode of the third transistor is connected to the pull-up node; and a first plate of the storage capacitor is connected to the pull-up node, and a second plate of the storage capacitor is connected to the signal output terminal.

In a second aspect, an embodiment of the present disclosure provides a gate driving circuit, which includes a plurality of cascaded shift registers; each shift register includes any one of the shift registers.

In a third aspect, an embodiment of the present disclosure provides a display panel, which includes the gate driving circuit.

DETAIL DESCRIPTION OF EMBODIMENTS

Figure 1:
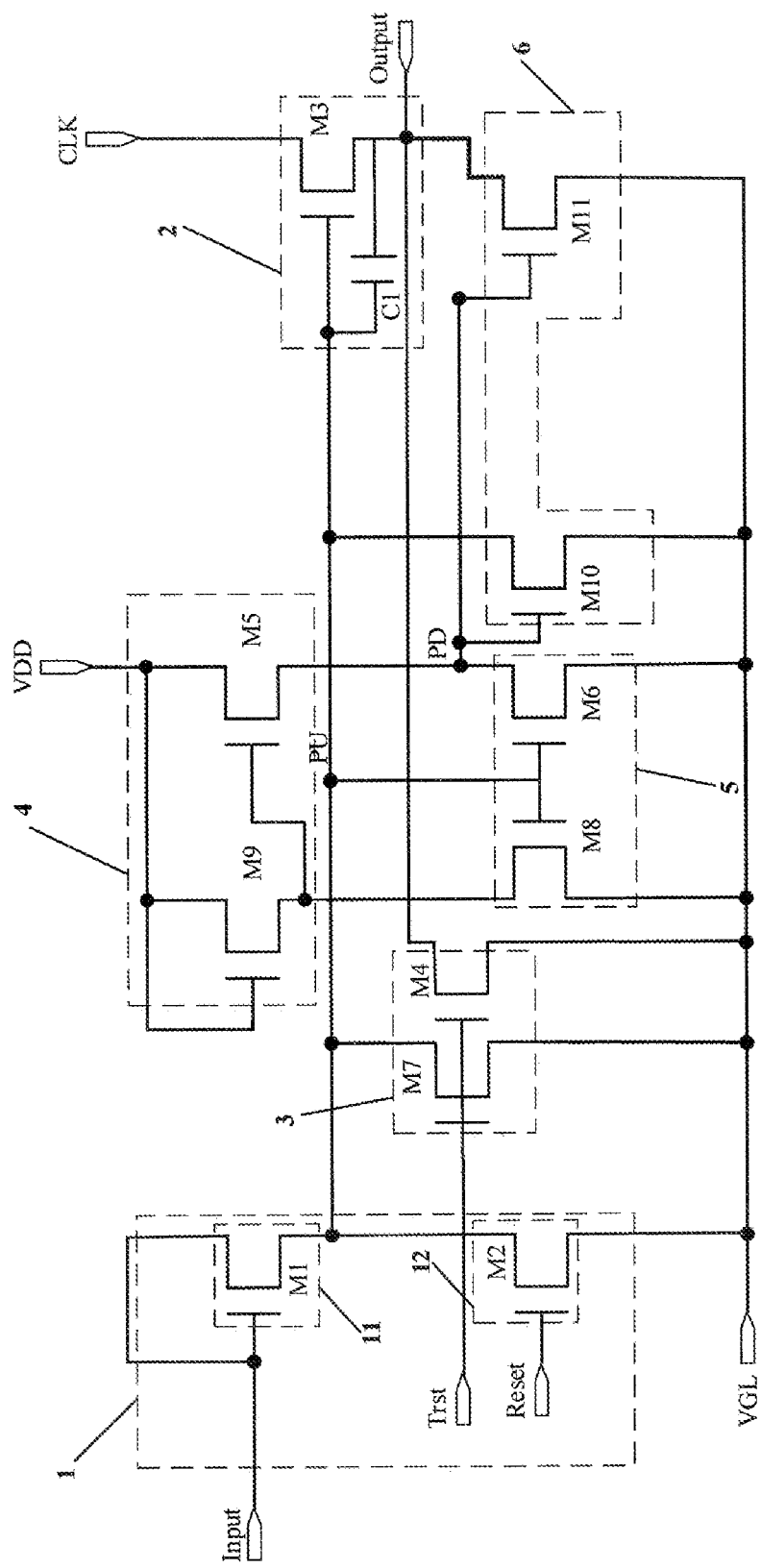
FIG. 1 is a circuit diagram of a shift register.

In order to enable one of ordinary skill in the art to better understand the technical solutions of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

It should be noted that transistors used in the embodiments of the present disclosure may be thin film transistors or field effect transistors or other devices having the same characteristics. A source electrode and a drain electrode of the transistor are symmetrical with respect to each other, so that the source electrode and the drain electrode are same. In the embodiments of the present disclosure, to distinguish the source electrode and the drain electrode of the transistor, one of the electrodes is referred to as a first electrode, the other electrode is referred to as a second electrode, and a gate electrode is referred to as a control electrode. Further, transistors may be classified into N-type and P-type transistors according to their characteristics. In the following embodiments, as an example, the transistors are as N-type transistors. When a N-type transistor is adopted, the first electrode is the source electrode of the N-type transistor, the second electrode is the drain electrode of the N-type transistor. When a high level signal is input to the gate electrode, the source electrode and the drain electrode are turned on. When a P-type transistor is adopted, the first electrode is the drain electrode of the P-type transistor, the second electrode is the source electrode of the P-type transistor. When a low level signal is input to the gate electrode, the source electrode and the drain electrode are turned on. It is contemplated that the implementation of the transistors as P-type transistors will be readily apparent to one skilled in the art without creative effort and, thus, is within the scope of the embodiments of the present disclosure.

In the embodiment of the present disclosure, since the transistor is an N-type transistor, an operating level signal in the embodiment of the present disclosure refers to a high level signal, and a non-operating level signal refers to a low level signal; a corresponding operating level terminal is a high level signal terminal, and a non-operating level terminal is a low level signal terminal. A first power voltage written into a first power voltage terminal is higher than a second power voltage written into a second power voltage terminal. In the embodiment of the present disclosure, as an example, the first power voltage is a high power voltage, and the second power voltage is a low power voltage.

The conventional display panel generally has a display region and a peripheral region surrounding the display region; a plurality of pixel units are arranged in an array in the display region, and a pixel circuit is arranged in each pixel unit; the pixel units in the same row are connected to the same gate line, and the pixel units in the same column are connected to the same data line. A gate driving circuit is arranged in the peripheral region and includes a plurality of cascaded shift registers GOA, the shift registers are in one-to-one correspondence with the gate lines. That is, each shift register is connected to one gate line. When each frame of picture is displayed, gate scanning signals are output by shift registers stage-by-stage to the gate lines corresponding to the shift registers so as to complete the row-by-row scanning of the pixel circuits. When each row of gate lines are scanned, data voltage signals are written by data lines into the pixel circuits in the row, so as to lighten the pixel units in the row. There is a blank stage between time of displaying for two frames of pictures, in which each row of pixel units does not display. For displaying a frame of picture, there are a display stage and a blank stage.

FIG. 1 is a circuit diagram of a shift register. As shown in FIG. 1, a shift register includes: an input circuit 1, an output circuit 2, a frame reset circuit 3, a pull-down control circuit 4, a pull-down circuit 5 and a first noise reduction circuit 6; the input circuit 1, the output circuit 2 and the pull-down circuit 5 are connected to a pull-up node PU as a connection node; the pull-down control circuit 4 and the pull-down circuit 5 are connected to a pull-down node PD. The input circuit 1 is configured to charge and reset the pull-up node PU; the output circuit 2 is configured to output a clock signal through a signal output terminal Output in response to a potential at the pull-up node PU; the frame reset circuit 3 is configured to reset the pull-up node PU and an output of the signal output terminal Output through a low level signal in response to a reset signal in the blank stage; the pull-down control circuit 4 is configured to control a potential at the pull-down node PD through the first power voltage in response to the first power voltage; the pull-down circuit 5 is configured to pull down the potential at the pull-down node PD through a low level signal in response to the pull-up node PU; the first noise reduction circuit is configured to denoise the pull-up node PU and the output of the signal output terminal Output in response to the potential at the pull-down node PD.

With continued reference to FIG. 1, the input circuit 1 may include an input sub-circuit 11 and a reset sub-circuit 12; the input sub-circuit 11 is configured to precharge the pull-up node PU through an input signal in response to the input signal; the reset sub-circuit 12 is configured to reset the pull-up node PU through a low level signal in response to a reset signal. As shown in FIG. 1, the input sub-circuit may include a first transistor M1, a source electrode and a gate electrode of the first transistor M1 are both connected to an input signal terminal Input, and a drain electrode of the first transistor M1 is connected to the pull-up node PU. In this case, when a high level signal is written into the input signal terminal Input, the first transistor M1 is turned on, and the pull-up node PU is precharged by the high level signal written into the input signal terminal Input. The reset sub-circuit may include a second transistor M2, a source electrode of the second transistor M2 is connected to the pull-up node PU, a drain electrode of the second transistor M2 is connected to a low level signal terminal VGL, and a gate electrode of the second transistor M2 is connected to a reset signal terminal Reset; in this case, when a high level signal is written into the reset signal terminal Reset, the second transistor M2 is turned on, and the pull-up node PU is pulled down and reset by a low level signal at the low level signal terminal VGL.

Referring to FIG. 1, the output circuit 2 in the shift register may include a third transistor M3 and a storage capacitor C1; a source electrode of the third transistor M3 is connected to a clock signal terminal CLK, a drain electrode of the third transistor M3 is connected to the signal output terminal Output, and a gate electrode of the third transistor M3 is connected to the pull-up node PU; a first plate of the storage capacitor C1 is connected to the pull-up node PU, and a second plate of the storage capacitor C1 is connected to the signal output terminal Output. In this case, when the pull-up node PU is charged to a high level signal, the storage capacitor C1 stores the high level signal, and simultaneously the third transistor M3 is turned on, and a clock signal input by the clock signal terminal CLK is output through the signal output terminal Output.

Referring to FIG. 1, the frame reset circuit 3 in the shift register may include a fourth transistor M4 and a seventh transistor M7; a source electrode of the fourth transistor M4 is connected to the signal output terminal Output, a drain electrode of the fourth transistor M4 is connected to the low level signal terminal VGL, and a gate electrode of the fourth transistor M4 is connected to a reset signal terminal Trst; a source electrode of the seventh transistor M7 is connected to the pull-up node PU, a drain electrode of the seventh transistor M7 is connected to the low level signal terminal VGL, and a gate electrode of the seventh transistor M7 is connected to the reset signal terminal Trst. In this case, when displaying one or more frames of pictures, the display stage is finished and the blank stage is entered, a high level signal is written into the reset signal terminal Trst, so that the fourth transistor M4 and the seventh transistor M7 are turned on, a low level signal at the low level signal terminal VGL resets the signal output terminal Output through the fourth transistor M4, and resets the pull-up node PU through the seventh transistor M7. The frame reset circuit 3 is provided in the shift register, so that the noise of the pull-up node PU and the signal output terminal Output in the display of one frame of picture may be effectively prevented from being transmitted to the display of the next frame of picture.

Referring to FIG. 1, the pull-down control circuit 4 in the shift register may include a fifth transistor M5 and a ninth transistor M9; a source electrode of the fifth transistor M5 is connected to the first power voltage terminal VDD, a drain electrode of the fifth transistor M5 is connected to the pull-down node PD, and a gate electrode of the fifth transistor M5 is connected to a drain electrode of the ninth transistor M9; a source electrode and a gate electrode of the ninth transistor M9 are connected to the first power voltage terminal VDD. In this case, a first power voltage at the first power voltage terminal VDD controls the fifth transistor M5 and the ninth transistor M9 to be turned on and pull up the potential at the pull-down node PD.

Referring to FIG. 1, the pull-down circuit 5 in the shift register may include a sixth transistor M6 and an eighth transistor M8; a source electrode of the sixth transistor M6 is connected to the pull-down node PD, a drain electrode of the sixth transistor M6 is connected to the low level signal terminal VGL, and a gate electrode of the sixth transistor M6 is connected to the pull-up node PU; a source electrode of the eighth transistor M8 is connected to the pull-down control circuit 4, a drain electrode of the eighth transistor M8 is connected to the low level signal terminal VGL, and a gate electrode of the eighth transistor M8 is connected to the pull-up node PU. In this case, when the potential of the pull-up node PU is a high level signal, both the sixth transistor M6 and the eighth transistor M8 are turned on, and the low level signal at the low level signal terminal VGL pulls down the potential at the pull-down node PD through the sixth transistor M6, and pulls down the potential at the pull-down control circuit 4 through the eighth transistor M8.

Referring to FIG. 1, the first noise reduction circuit 6 in the shift register may include a tenth transistor M10 and an eleventh transistor M11; a source electrode of the tenth transistor M10 is connected to the pull-down node PU, a drain electrode of the tenth transistor M10 is connected to the low level signal terminal VGL, and a gate electrode of the tenth transistor M10 is connected to the pull-down node PD; a source electrode of the eleventh transistor M11 is connected to the signal output terminal Output, a drain electrode of the eleventh transistor M11 is connected to the low level signal terminal VGL, and a gate electrode of the eleventh transistor M11 is connected to the pull-down node PD. In this case, when the pull-down node PD is at a high level, the tenth transistor M10 and the eleventh transistor M11 are turned on, and a low level signal at the low level signal terminal VGL denoises an output of the pull-up node PU through the tenth transistor M10, and denoises an output of the signal output terminal Output through the tenth transistor M10.

Figure 2:
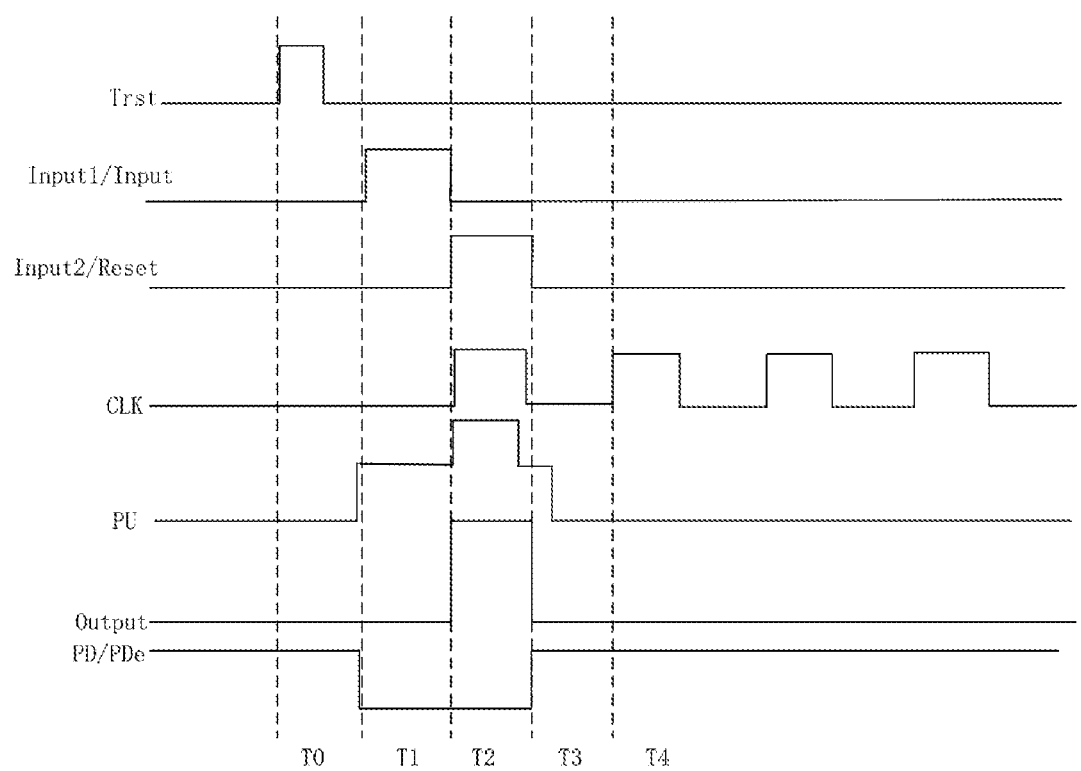
FIG. 2 is a timing diagram of an operation of a shift register.

FIG. 2 is a timing diagram of an operation of a shift register. Referring to FIGS. 1 and 2, a driving method for the shift register includes a display stage and a blank stage for displaying one frame of picture. The blank stage includes a frame reset stage T0; the display stage includes a precharge stage T1, an output stage T2, a reset stage T3 and a noise reduction stage T4.

The frame reset stage T0: a high level signal is input to the reset signal terminal Trst, so that the fourth transistor M4 and the seventh transistor M7 are turned on, and a low level signal at the low level signal terminal VGL pulls down the output of the signal output terminal Output through the fourth transistor M4, and pulls down the potential at the pull-up node PU through the seventh transistor M7, so that the noise of the signal output terminal Output and the pull-up node PU is effectively prevented from affecting the display of the next frame of picture.

The precharge stage T1: a high level signal is input to the input signal terminal Input, so that the first transistor M1 is turned on, and the pull-up node PU is precharged by the high level signal at the input signal terminal Input.

The output stage T2: a low level signal is written into the input signal terminal Input, so that the first transistor M1 is turned off, and the pull-up node PU keeps the high level potential of the precharge stage T1; at this time, the third transistor M3 is turned on, a high level signal is input to the clock signal terminal CLK, and the pull-up node PU is amplified due to a bootstrapping voltage of the storage capacitor C1, so as to ensure that the third transistor M3 is continuously turned on, so that the signal output terminal Output outputs a high level signal.

The reset stage T3: a high level signal is written into the reset signal terminal Reset, so that the second transistor M2 is turned on, and the potential at the pull-up node PU is pulled down and reset by a low level signal at the low level signal terminal VGL.

The noise reduction stage T4: the pull-up node PU is pulled down to the low level potential during the reset stage T3; and the fifth transistor M5 and the ninth transistor M9 are always controlled by the first power voltage written into the first power voltage terminal VDD, so that the potential at the pull-down node PD is a high level signal, the tenth transistor M10 and the eleventh transistor M11 are turned on, a low level signal written into the low level signal terminal VGL denoises the output of the pull-up node PU through the tenth transistor M10, and denoises the output of the signal output terminal Output through the eleventh transistor M11.

The shift register repeats the noise reduction stage T4 until the next frame of picture arrives, thereby denoising the shift register continually. The blank stage is between the end of the display of the frame of picture and the beginning of the next frame of picture.

The inventor found that since the fifth transistor M5 and the ninth transistor M9 are always controlled by the first power voltage, the potential at the pull-down node PD is affected by the first power voltage in the precharge stage T1, which may easily cause a leakage current to generate in the tenth transistor M10, and affect the potential at the pull-up node PU, so that the pull-up node PU cannot be effectively charged.

In view of the above problems, the following technical solutions are provided in the embodiments of the present disclosure.

In a first aspect, referring to FIGS. 3 to 10, an embodiment of the present disclosure provides a shift register, which includes an input circuit 1, an output circuit 2, at least one pull-down control circuit 4, at least one pull-down circuit 5, at least one first auxiliary circuit 7 and at least one first noise reduction circuit 6; the input circuit 1 is configured to precharge and reset the pull-up node PU; the input circuit 1, the output circuit 2 and the at least one pull-down circuit 5 are connected to the pull-up node PU as a connection node; one pull-down control circuit 4 is electrically connected to one pull-down circuit 5 through a pull-down node PD; the pull-down control circuit 4 is configured to control the potential at the pull-down node PD under the control of the first power voltage; each pull-down circuit 5 is configured to pull down the potential at the pull-down node PD in response to the potential at the pull-up node PU; the output circuit 2 is configured to output a clock signal through a signal output terminal Output in response to a potential at the pull-up node PU; one first noise reduction circuit 6 is connected to one pull-down node PD; the first noise reduction circuit 6 is configured to denoise the pull-up node PU and the output of the signal output terminal Output through a non-operating level signal in response to the pull-down node PD; one first auxiliary circuit 7 is electrically connected to one pull-down node PD; the first auxiliary circuit 7 is configured to pull down the potential at the pull-down node PD by a low level signal in the precharge stage T1 in response to the input signal.

It should be noted that the numbers of the pull-down control circuits 4, the pull-down circuits 5 and the first auxiliary circuits 7 in the shift register may be the same; the at least one pull-down control circuit 4 and the at least one pull-down circuit 5 may be connected to each other (but not limited to) in a one-to-one correspondence; the at least one first auxiliary circuit 7 and the at least one first noise reduction circuit 6 are connected to the pull-down nodes PD in a one-to-one correspondence. In the embodiment of the present disclosure, the shift register includes one or two pull-down control circuits 4, one or two pull-down circuits 5, and one or two first auxiliary circuits 7 for describing the shift register in the embodiment of the present disclosure, as an example.

Since the shift register of the embodiment of the present disclosure includes the first auxiliary circuits 7 connected to the pull-down nodes PD in a one-to-one correspondence, and configured to pull down the potential at the pull-down nodes PD by a low level signal in the precharge stage T1, thereby avoiding that the potential at the pull-down nodes PD in the precharge stage T1 controls the first noise reduction circuit 6 to pull down the pull-up nodes PU, thereby affecting the charging of the pull-up nodes PU.

In addition, in the shift register of the embodiment of the present disclosure, the output circuit 2, the pull-down control circuit 4, the pull-down circuit 5, and the first noise reduction circuit 6 may all adopt the structure as those in FIG. 1. In the embodiment of the present disclosure, as an example, the output circuit 2, the pull-down control circuit 4, the pull-down circuit 5, and the first noise reduction circuit 6 all adopt the structure as those in FIG. 1, for describing the structure of the shift register in the embodiment of the present disclosure.

In some embodiments, the shift register may implement bidirectional (forward and reverse) scanning. The input circuit 1 includes a first input sub-circuit 11 and a second input sub-circuit 12; in the embodiment of the present disclosure, in the forward scanning, the first input sub-circuit 11 is configured to precharge the pull-up node PU by a first voltage in response to a first input signal, and the second input sub-circuit 12 is configured to reset the pull-up node by a second voltage in response to a second input signal. In the reverse scanning, the first input sub-circuit 11 is configured to reset the pull-up node by the second voltage in response to the second input signal, and the second input sub-circuit 12 is configured to precharge the pull-up node PU by the first voltage in response to the first input signal. That is, in the forward scanning, a first input signal terminal Input1 serves as an input signal terminal Input, and a second input signal terminal Input2 serves as a reset signal terminal Reset; in the reverse scanning, the first input signal terminal Input1 serves as the reset signal terminal Reset, and the second input signal terminal Input2 serves as the input signal terminal Input.

In some embodiments, the first input sub-circuit 11 may include a first transistor M1, the second input sub-circuit 12 may include a second transistor M2; a source electrode of the first transistor M1 is connected to a first voltage terminal, a drain electrode of the first transistor M1 is connected to the pull-up node PU, and a gate electrode of the first transistor M1 is connected to the first input signal terminal Input1; a source electrode of the second transistor M2 is connected to the pull-up node PU, a drain electrode of the second transistor M2 is connected to the low level signal terminal VGL, and a gate electrode of the second transistor M2 is connected to the second input signal terminal Input2.

For example: in the forward scanning, in the precharge stage T1, a high level signal is written into the first input signal terminal Input1, so that the first transistor M1 is turned on, the first voltage (for example, a high level signal) is written into the first voltage terminal, and the pull-up node PU is precharged by the first voltage. In the reset stage T3, a high level signal is written into the second input signal terminal Input2, so that the second transistor M2 is turned on, the second voltage (for example, a low level signal) is written into the second voltage terminal, and the pull-up node PU is reset by the second voltage.

In the reverse scanning, in the precharge stage T1, a high level signal is written into the second input signal terminal Input2, so that the second transistor M2 is turned on, the first voltage (for example, a high level signal) is written into the second voltage terminal, and the pull-up node PU is precharged by the first voltage. In the reset stage T3, a high level signal is written into the first input signal terminal Input1, so that the first transistor M1 is turned on, the first voltage (for example, a low level signal) is written into the first voltage terminal, and the pull-up node PU is reset by the second voltage.

From the above, it may be seen that the first input sub-circuit 11 and the second input sub-circuit 12 may have the same structure, and functions of the first input sub-circuit 11 and the second input sub-circuit 12 may be interchanged for ease of control only in the forward scanning and the reverse scanning, but the operation principles for the first input sub-circuit 11 and the second input sub-circuit 12 are the same.

In some embodiments, the shift register may implement only unidirectional scanning, in which case, the input circuit 1 may include an input sub-circuit and a reset sub-circuit; the input sub-circuit is configured to precharge the pull-up node PU through an input signal in response to the input signal; the reset sub-circuit is configured to reset the pull-up node PU through a low level signal in response to a reset signal.

For example: the input sub-circuit may include a first transistor M1, a source electrode and a gate electrode of the first transistor M1 are both connected to an input signal terminal Input, and a drain electrode of the first transistor M1 is connected to the pull-up node PU. In this case, when a high level signal is written into the input signal terminal Input, the first transistor M1 is turned on, and the pull-up node PU is precharged by the high level signal written into the input signal terminal. The reset sub-circuit may include a second transistor M2, a source electrode of the second transistor M2 is connected to the pull-up node PU, a drain electrode of the second transistor M2 is connected to a low level signal terminal VGL, and a gate electrode of the second transistor M2 is connected to a reset signal terminal Reset; in this case, when a high level signal is written into the reset signal terminal Reset, the second transistor M2 is turned on, and the pull-up node PU is pulled down and reset by a low level signal at the low level signal terminal VGL.

In some embodiments, when the shift register is a shift register for implementing the bidirectional scanning, the input circuit 1 includes not only the first input sub-circuit 11 and the second input sub-circuit 12, but also a first anticreep sub-circuit 13 and a second anticreep sub-circuit 14; the first anticreep sub-circuit 13 is configured to prevent the first input sub-circuit 11 from leaking electricity to affect the potential at the pull-up node PU in the forward scanning; the second anticreep sub-circuit 14 is configured to prevent the second input sub-circuit 12 from leaking electricity to affect the potential at the pull-up node PU in the reverse scanning.

In some embodiments, the first anticreep sub-circuit 13 may include a twelfth transistor M12; the second anticreep sub-circuit 14 may include a thirteenth transistor M13; a source electrode of the twelfth transistor M12 is connected to the first voltage terminal, a drain electrode of the twelfth transistor M12 is connected to the first input sub-circuit 11, and a gate electrode of the twelfth transistor M12 is connected to the first input signal terminal Input1; a source electrode of the thirteenth transistor M13 is connected to the second voltage terminal, a drain electrode of the thirteenth transistor M13 is connected to the second input sub-circuit 12, and a gate electrode of the thirteenth transistor M13 is connected to the second input signal terminal Input2.

For example, the first input sub-circuit 11 includes the first transistor M1; the second input sub-circuit 12 includes the second transistor M2, as an example; during the forward scanning, in the precharge stage T1, a high level signal is written into the first input signal terminal Input1, so that the first transistor M1 and the twelfth transistor M12 are both turned on, and the pull-up node PU is charged by the first voltage written into the first voltage terminal; at each stage after the precharge stage, a low level signal is written into the first input signal terminal Input1, at this time, because of the existence of the twelfth transistor M12, the problem that the potential at the pull-up node PU is affected by the leakage of the first transistor M1 may be effectively avoided. Similarly, during the reverse scanning, in the precharge stage T1, a high level signal is written into the second input signal terminal Input2, so that the second transistor M2 and the thirteenth transistor M13 are both turned on, and the pull-up node PU is charged by the first voltage written into the second voltage terminal; at each stage after the precharge stage, a low level signal is written into the first input signal terminal Input1, at this time, because of the existence of the thirteenth transistor M13, the problem that the potential at the pull-up node PU is affected by the leakage of the second transistor M2 may be effectively avoided.

In some embodiments, when the input circuit 1 includes the first anticreep sub-circuit 13 and the second anticreep sub-circuit 14, the shift register may further include at least one second noise reduction circuit 8 and at least one third noise reduction circuit 9; the at least one second noise reduction circuit 8 is connected to the pull-down nodes in a one-to-one correspondence, and the at least one third noise reduction circuit 9 is connected to the pull-down nodes PD in a one-to-one correspondence.

In some embodiments, the second noise reduction circuit 8 may include an eighteenth transistor M18; the third noise reduction circuit 9 may include a nineteenth transistor M19; the first input sub-circuit 11 and the first anticreep sub-circuit 13 are connected to a first connection node CN1 as a connection node; the second input sub-circuit 12 and the second anticreep sub-circuit 14 are connected to a second connection node CN2 as a connection node; a source electrode of the eighteenth transistor M18 is connected to the first connection node CN1, a drain electrode of the eighteenth transistor M18 is connected to the low level signal terminal VGL, and a gate electrode of the eighteenth transistor M18 is connected to the pull-down node PD; a source electrode of the nineteenth transistor M19 is connected to the second connection node CN2, a drain electrode of the nineteenth transistor M19 is connected to the low level signal terminal VGL, and a gate electrode of the nineteenth transistor M19 is connected to the pull-down node PD.

For example, during the forward scanning, in the noise reduction stage T4, the potential at the pull-down node PD is set to high by the pull-down control circuit 4, so that the eighteenth transistor M18 is turned on, and the low level signal at the low level signal terminal VGL denoises an output of the first connection node CN1 through the eighteenth transistor M18. During the reverse scanning, in the noise reduction stage T4, the potential at the pull-down node PD is set to high by the pull-down control circuit 4, so that the nineteenth transistor M19 is turned on, and the low level signal at the low level signal terminal VGL denoises an output of the second connection node CN2 through the nineteenth transistor M19.

In some embodiments, when the shift register is a shift register for implementing the bidirectional scanning, the first auxiliary circuit 7 includes a first auxiliary sub-circuit 71 and a second auxiliary sub-circuit 72; the first auxiliary sub-circuit 71 is configured to pull down the potential at the pull-down node PD by a low level signal in response to the first input signal in the forward scanning; the second auxiliary sub-circuit 72 is configured to pull down the potential at the pull-down node PD by a low level signal in response to the first input signal in the reverse scanning.

In some embodiments, the first auxiliary sub-circuit 71 includes a sixteenth transistor M16, the second auxiliary sub-circuit 72 includes a seventeenth transistor M17; a source electrode of the sixteenth transistor M16 is connected to the pull-down node PD, a drain electrode of the sixteenth transistor M16 is connected to the low level signal terminal VGL, and a gate electrode of the sixteenth transistor M16 is connected to the first input signal terminal Input1; a source electrode of the seventeenth transistor M17 is connected to the pull-down node PD, a drain electrode of the seventeenth transistor M17 is connected to the low level signal terminal VGL, and a gate electrode of the seventeenth transistor M17 is connected to the second input signal terminal.

For example: in the forward scanning, in the precharge stage T1, a high level signal is input to the first input signal terminal Input1, so that the sixteenth transistor M16 is turned on, and the potential at the pull-down node PD is pulled down by the low level signal, so as to prevent the first noise reduction circuit 6 from leaking electricity to affect the potential at the pull-up node PU. During the reverse scanning, in the precharge stage T1, a high level signal is input to the second input signal terminal Input2, so that the seventeenth transistor M17 is turned on, and the potential at the pull-down node PD is pulled down by the low level signal, so as to prevent the first noise reduction circuit 6 from leaking electricity to affect the potential at the pull-up node PU.

In some embodiments, the pull-down control circuit 4 and the pull-down circuit 5 may have the structure as shown in FIG. 1, that is, the pull-down control circuit 4 includes the fifth transistor M5 and the ninth transistor M9, and the pull-down circuit 5 includes the sixth transistor M6 and the eighth transistor M8. In the embodiment of the present disclosure, the pull-down control circuit 4 may further include only the fifth transistor M5, while the pull-down circuit 5 may include only the sixth transistor M6.

For example: in one example, source and gate electrodes of the fifth transistor M5 are connected to the first power voltage terminal VDD, and a drain electrode of the fifth transistor M5 is connected to the pull-down node PD; a source electrode of the sixth transistor M6 is connected to the pull-down node PD, a drain electrode of the sixth transistor M6 is connected to the low level signal terminal VGL, and a gate electrode of the sixth transistor M6 is connected to the pull-up node PU. In the noise reduction stage T4 and each time period before the next frame of picture is displayed, the first power voltage is continuously written into the first power voltage terminal VDD, so that the fifth transistor M5 is turned on, the pull-down node PD is at a high level potential, and at this time, the first noise reduction circuit 6 operates to denoise the pull-up node PU and the output of the signal output terminal Output.

In another example, the source and gate electrodes of the fifth transistor M5 are connected to the first control signal terminal, and the drain electrode of the fifth transistor M5 is connected to the pull-down node PD; the source electrode of the sixth transistor M6 is connected to the pull-down node PD, the drain electrode of the sixth transistor M6 is connected to the low level signal terminal VGL, and the gate electrode of the sixth transistor M6 is connected to the pull-up node PU. In this case, the shift register of the embodiment of the present disclosure further includes a fourth noise reduction circuit 10 configured to denoise the output of the signal output terminal Output by a low level signal in response to the second control signal in the blank stage. For example: the fourth noise reduction circuit 10 may include a twentieth transistor M20, a source electrode of the twentieth transistor M20 is connected to the signal output terminal Output, a drain electrode of the twentieth transistor M20 is connected to the low level signal terminal VGL, and a gate electrode of the twentieth transistor M20 is connected to the second control signal terminal. In the display stage, the first power voltage is continuously written into the first control signal terminal, so that the fifth transistor M5 is turned on, the pull-down node is at a high level, and in the noise reduction stage T4, the pull-up node PU and the output of the signal output terminal Output denoised by the first noise reduction circuit 6. In the blank stage, a low level signal is written into the first control signal terminal, a high level signal is written into the second control signal terminal, so that the twentieth transistor M20 is turned on, and a low level signal at the low level signal terminal VGL denoises the output of the signal output terminal Output through the second transistor M2 in the blank stage.

In the embodiment of the present disclosure, the first noise reduction circuit 6 and the output circuit 2 may adopt the same structure as that in FIG. 1, and therefore, the description thereof is not repeated.

In order to clarify the specific structure of the shift register in the embodiment of the present disclosure, the shift register in the embodiment of the present disclosure is specifically described below with reference to specific examples. It should be understood that only several exemplary circuit structures of shift registers are given, but this does not limit the scope of the embodiments of the present disclosure.

Figure 3:
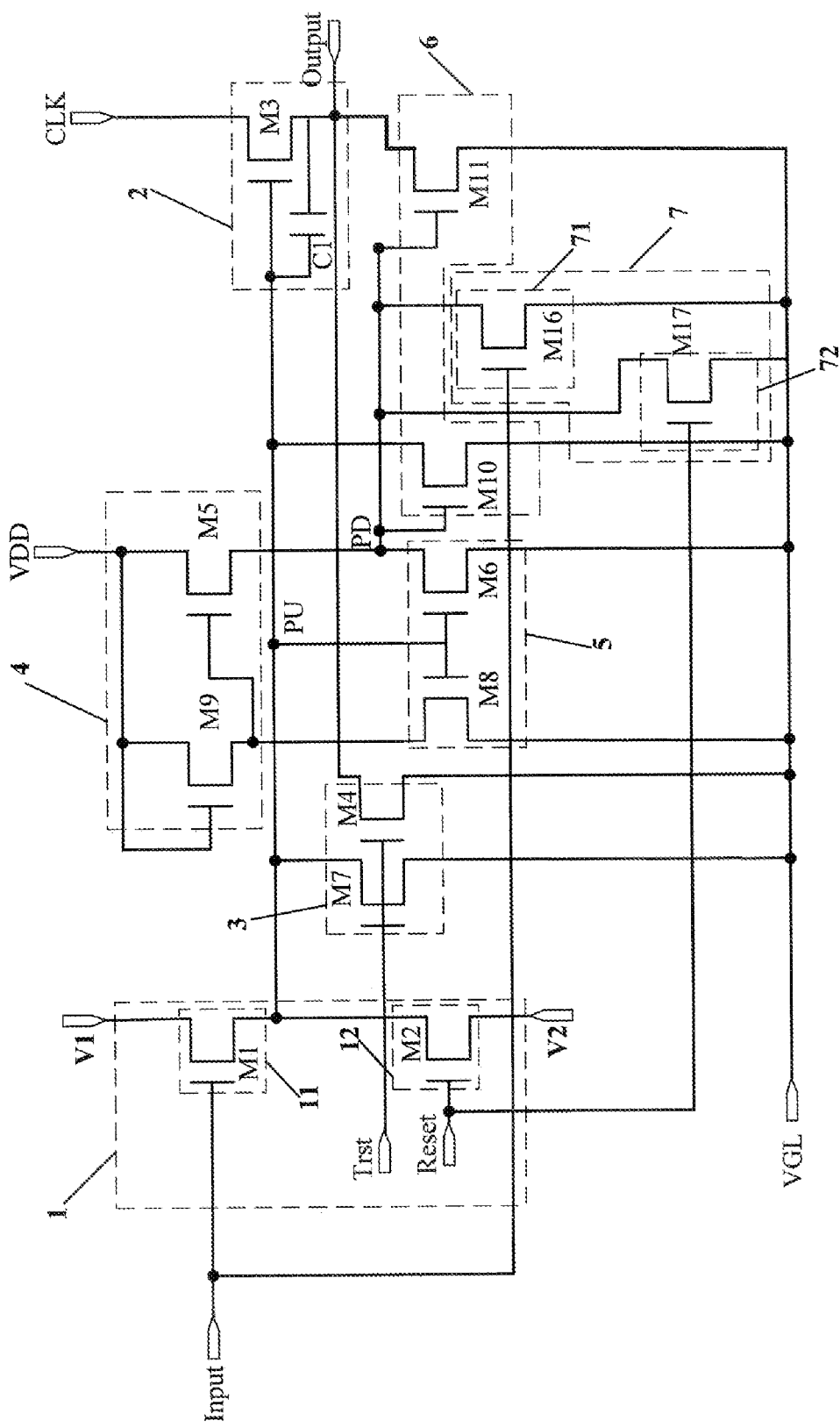
FIG. 3 is a circuit diagram of a shift register according to an embodiment of the present disclosure.

In one example, FIG. 3 is a schematic diagram of a circuit of a shift register according to an embodiment of the present disclosure. As shown in FIG. 3, the shift register may implement the bidirectional scanning, and includes the input circuit 1, the output circuit 2, a frame reset circuit 3, the pull-down control circuit 4, the pull-down circuit 5, the first noise reduction circuit 6, and the first auxiliary circuit 7. The number of each of the pull-down control circuit 4, the pull-down circuit 5, the first noise reduction circuit 6 and the first auxiliary circuit 7 is 1; the input circuit 1 includes the first input sub-circuit 11 and the second output sub-circuit; the first auxiliary circuit 7 includes the first auxiliary sub-circuit 71 and the second auxiliary sub-circuit 72; the first input sub-circuit 11 includes the first transistor M1, the second input sub-circuit 12 includes the second transistor M2; the output circuit 2 includes a third transistor M3 and a storage capacitor C1; the frame reset circuit 3 includes a fourth transistor M4 and a seventh transistor M7; the pull-down control circuit 4 includes a fifth transistor M5 and a ninth transistor M9; the pull-down circuit 5 includes a sixth transistor M6 and an eighth transistor M8; the first noise reduction circuit 6 includes a tenth transistor M10 and an eleventh transistor M11; the first auxiliary sub-circuit 71 includes a sixteenth transistor M16; the second auxiliary sub-circuit 72 includes a seventeenth transistor M17.

With continued reference to FIG. 3, a source electrode of the first transistor M1 is connected to a first voltage terminal, a drain electrode of the first transistor M1 is connected to the pull-up node PU, and a gate electrode of the first transistor M1 is connected to the first input signal terminal Input1; a source electrode of the second transistor M2 is connected to the pull-up node PU, a drain electrode of the second transistor M2 is connected to the low level signal terminal VGL, and a gate electrode of the second transistor M2 is connected to the second input signal terminal Input2. A source electrode of the third transistor M3 is connected to a clock signal terminal CLK, a drain electrode of the third transistor M3 is connected to the signal output terminal Output, and a gate electrode of the third transistor M3 is connected to the pull-up node PU; a first plate of the storage capacitor C1 is connected to the pull-up node PU, and a second plate of the storage capacitor C1 is connected to the signal output terminal Output. A source electrode of the fourth transistor M4 is connected to the signal output terminal Output, a drain electrode of the fourth transistor M4 is connected to the low level signal terminal VGL, and a gate electrode of the fourth transistor M4 is connected to a reset signal terminal Trst; a source electrode of the seventh transistor M7 is connected to the pull-up node PU, a drain electrode of the seventh transistor M7 is connected to the low level signal terminal VGL, and a gate electrode of the seventh transistor M7 is connected to the reset signal terminal Trst. A source electrode of the fifth transistor M5 is connected to the first power voltage terminal VDD, a drain electrode of the fifth transistor M5 is connected to the pull-down node PD, and a gate electrode of the fifth transistor M5 is connected to a drain electrode of the ninth transistor M9; a source electrode and a gate electrode of the ninth transistor M9 are connected to the first power voltage terminal VDD. A source electrode of the sixth transistor M6 is connected to the pull-down node PD, a drain electrode of the sixth transistor M6 is connected to the low level signal terminal VGL, and a gate electrode of the sixth transistor M6 is connected to the pull-up node PU; a source electrode of the eighth transistor M8 is connected to the drain electrode of the ninth transistor M9 and the gate electrode of the fifth transistor M5, a drain electrode of the eighth transistor M8 is connected to the low level signal terminal VGL, and a gate electrode of the eighth transistor M8 is connected to the pull-up node PU. A source electrode of the tenth transistor M10 is connected to the pull-down node PU, a drain electrode of the tenth transistor M10 is connected to the low level signal terminal VGL, and a gate electrode of the tenth transistor M10 is connected to the pull-down node PD; a source electrode of the eleventh transistor M11 is connected to the signal output terminal Output, a drain electrode of the eleventh transistor M11 is connected to the low level signal terminal VGL, and a gate electrode of the eleventh transistor M11 is connected to the pull-down node PD. A source electrode of the sixteenth transistor M16 is connected to the pull-down node PD, a drain electrode of the sixteenth transistor M16 is connected to the low level signal terminal VGL, and a gate electrode of the sixteenth transistor M16 is connected to the first input signal terminal Input1; a source electrode of the seventeenth transistor M17 is connected to the pull-down node PD, a drain electrode of the seventeenth transistor M17 is connected to the low level signal terminal VGL, and a gate electrode of the seventeenth transistor M17 is connected to the second input signal terminal.

The first input sub-circuit 11 and the second input sub-circuit 12 may have the same structure, and functions of the first input sub-circuit 11 and the second input sub-circuit 12 may be interchanged for ease of control only in the forward scanning and the reverse scanning, but the operation principles for the first input sub-circuit 11 and the second input sub-circuit 12 are the same. That is, during the forward scanning, the first input sub-circuit 11 is used to precharge the pull-up node PU, the second input sub-circuit 12 is used to reset the pull-up node PU; and during the reverse scanning, the first input sub-circuit 11 is used to reset the pull-up node PU, and the second input sub-circuit 12 is used to precharge the pull-up node PU. In the embodiments of the present disclosure, the driving method for the shift register is described by taking the forward scanning of the shift register as an example. During the forward scanning, the first auxiliary sub-circuit 71 operates, and the second auxiliary sub-circuit 72 does not operate; and during the reverse scanning, the first auxiliary sub-circuit 71 does not operate, and the second auxiliary sub-circuit 72 operates.

FIG. 2 is a timing diagram of an operation of a shift register. Referring to FIGS. 3 and 2, a driving method for the shift register includes a display stage and a blank stage for displaying one frame of picture. The blank stage includes a frame reset stage T0; the display stage includes a precharge stage T1, an output stage T2, a reset stage T3 and a noise reduction stage T4.

The frame reset stage T0: a high level signal is input to the reset signal terminal Trst, so that the fourth transistor M4 and the seventh transistor M7 are turned on, and a low level signal at the low level signal terminal VGL pulls down the output of the signal output terminal Output through the fourth transistor M4, and pulls down the potential at the pull-up node PU through the seventh transistor M7, so that the noise of the signal output terminal Output and the pull-up node PU is effectively prevented from affecting the display of the next frame of picture.

The precharge stage T1: a high level signal is input to the first input signal terminal Input1, so that the first transistor M1 is turned on, and the pull-up node PU is precharged by the high level signal at the first input signal terminal Input1; and the sixteenth transistor M16 is turned on, and the potential at the pull-down node PD is pulled down by a low level signal at the level signal terminal, so that the potential at the pull-up node PU is effectively prevented from being influenced by leakage of the tenth transistor M10.

The output stage T2: a low level signal is written into the first input signal terminal Input1, so that the first transistor M1 is turned off, and the pull-up node PU keeps the high level potential of the precharge stage T1; at this time, the third transistor M3 is turned on, a high level signal is input to the clock signal terminal CLK, and the pull-up node PU is amplified due to a bootstrapping voltage of the storage capacitor C1, so as to ensure that the third transistor M3 is continuously turned on, so that the signal output terminal Output outputs a high level signal.

The reset stage T3: a reset signal (i.e., a high level signal) is written into the second input signal terminal Input2, so that the second transistor M2 is turned on, and the potential at the pull-up node PU is pulled down and reset by a low level signal at the low level signal terminal VGL.

The noise reduction stage T4: the pull-up node PU is pulled down to the low level potential during the reset stage T3; and the fifth transistor M5 and the ninth transistor M9 are always controlled by the first power voltage written into the first power voltage terminal VDD, so that the potential at the pull-down node PD is a high level signal, the tenth transistor M10 and the eleventh transistor M11 are turned on, a low level signal written into the low level signal terminal VGL denoises the output of the pull-up node PU through the tenth transistor M10, and denoises the output of the signal output terminal Output through the eleventh transistor M11.

The shift register repeats the noise reduction stage T4 until the next frame of picture arrives, thereby denoising the shift register continually. The blank stage is between the end of the display of the frame of picture and the beginning of the next frame of picture.

Figure 4:
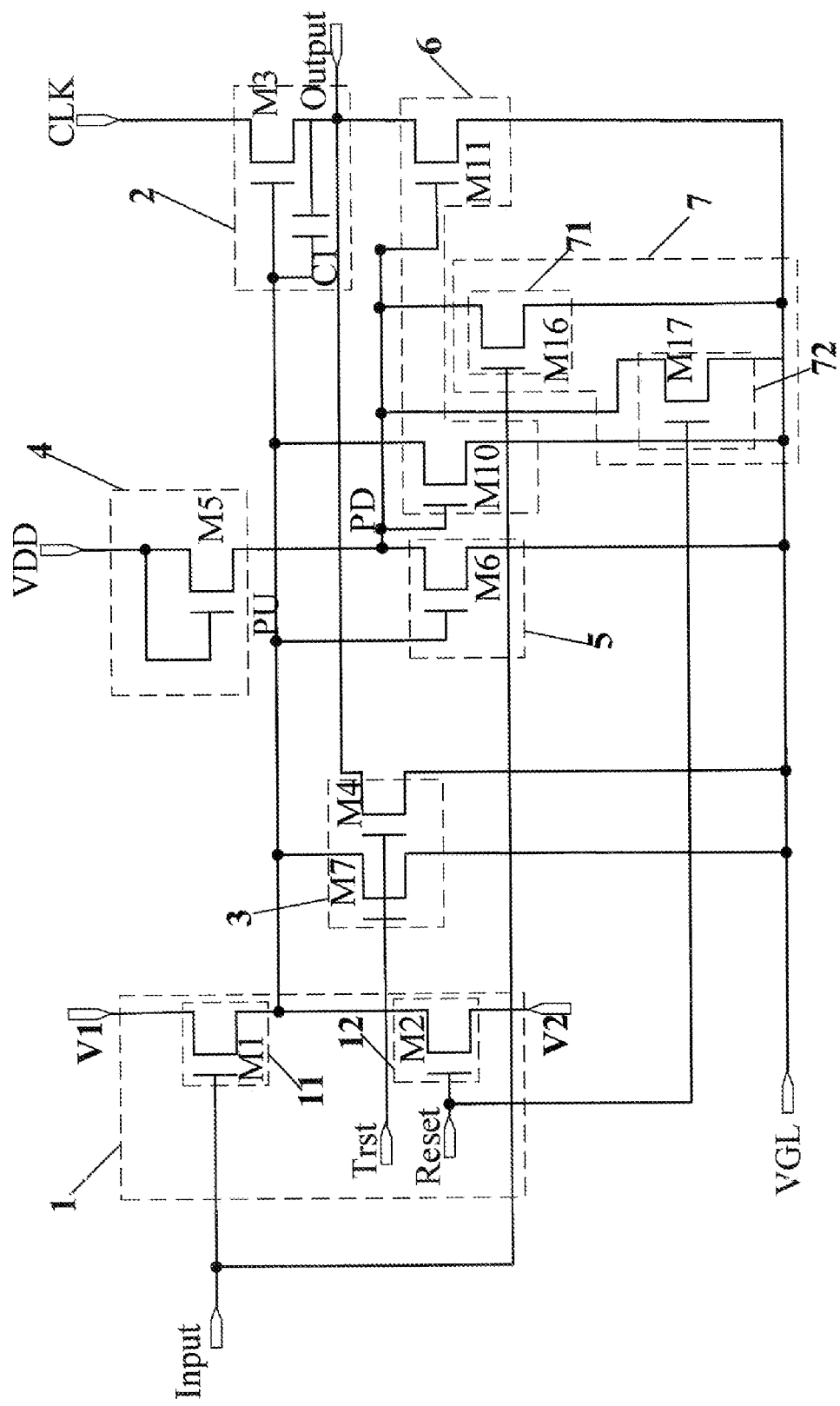
FIG. 4 is a circuit diagram of another shift register according to an embodiment of the present disclosure.

In another example, FIG. 4 is a schematic diagram of a circuit of another shift register of an embodiment of the present disclosure. As shown in FIG. 4, the shift register may implement bidirectional scanning, and includes the input circuit 1, the output circuit 2, a frame reset circuit 3, the pull-down control circuit 4, the pull-down circuit 5, the first noise reduction circuit 6, and the first auxiliary circuit 7. The number of each of the pull-down control circuit 4, the pull-down circuit 5, the first noise reduction circuit 6 and the first auxiliary circuit 7 is 1; the input circuit 1 includes the first input sub-circuit 11 and the second output sub-circuit; the first auxiliary circuit 7 includes the first auxiliary sub-circuit 71 and the second auxiliary sub-circuit 72; the first input sub-circuit 11 includes the first transistor M1, the second input sub-circuit 12 includes the second transistor M2; the output circuit 2 includes a third transistor M3 and a storage capacitor C1; the frame reset circuit 3 includes a fourth transistor M4 and a seventh transistor M7; the pull-down control circuit 4 includes a fifth transistor M5; the pull-down circuit 5 includes a sixth transistor M6; the first noise reduction circuit 6 includes a tenth transistor M10 and an eleventh transistor M11; the first auxiliary sub-circuit 71 includes a sixteenth transistor M16; the second auxiliary sub-circuit 72 includes a seventeenth transistor M17.

With continued reference to FIG. 4, a source electrode of the first transistor M1 is connected to a first voltage terminal, a drain electrode of the first transistor M1 is connected to the pull-up node PU, and a gate electrode of the first transistor M1 is connected to the first input signal terminal Input1; a source electrode of the second transistor M2 is connected to the pull-up node PU, a drain electrode of the second transistor M2 is connected to the low level signal terminal VGL, and a gate electrode of the second transistor M2 is connected to the second input signal terminal Input2. A source electrode of the third transistor M3 is connected to a clock signal terminal CLK, a drain electrode of the third transistor M3 is connected to the signal output terminal Output, and a gate electrode of the third transistor M3 is connected to the pull-up node PU; a first plate of the storage capacitor C1 is connected to the pull-up node PU, and a second plate of the storage capacitor C1 is connected to the signal output terminal Output. A source electrode of the fourth transistor M4 is connected to the signal output terminal Output, a drain electrode of the fourth transistor M4 is connected to the low level signal terminal VGL, and a gate electrode of the fourth transistor M4 is connected to a reset signal terminal Trst; a source electrode of the seventh transistor M7 is connected to the pull-up node PU, a drain electrode of the seventh transistor M7 is connected to the low level signal terminal VGL, and a gate electrode of the seventh transistor M7 is connected to the reset signal terminal Trst. Source and gate electrodes of the fifth transistor M5 are connected to the first power voltage terminal VDD, and a drain electrode of the fifth transistor M5 is connected to the pull-down node PD. A source electrode of the sixth transistor M6 is connected to the pull-down node PD, a drain electrode of the sixth transistor M6 is connected to the low level signal terminal VGL, and a gate electrode of the sixth transistor M6 is connected to the pull-up node PU. A source electrode of the tenth transistor M10 is connected to the pull-down node PU, a drain electrode of the tenth transistor M10 is connected to the low level signal terminal VGL, and a gate electrode of the tenth transistor M10 is connected to the pull-down node PD; a source electrode of the eleventh transistor M11 is connected to the signal output terminal Output, a drain electrode of the eleventh transistor M11 is connected to the low level signal terminal VGL, and a gate electrode of the eleventh transistor M11 is connected to the pull-down node PD. A source electrode of the sixteenth transistor M16 is connected to the pull-down node PD, a drain electrode of the sixteenth transistor M16 is connected to the low level signal terminal VGL, and a gate electrode of the sixteenth transistor M16 is connected to the first input signal terminal Input1; a source electrode of the seventeenth transistor M17 is connected to the pull-down node PD, a drain electrode of the seventeenth transistor M17 is connected to the low level signal terminal VGL, and a gate electrode of the seventeenth transistor M17 is connected to the second input signal terminal.

FIG. 2 is a timing diagram of an operation of a shift register. Referring to FIGS. 2 and 4, a driving method for the shift register includes a display stage and a blank stage for displaying one frame of picture. The blank stage includes a frame reset stage T0; the display stage includes a precharge stage T1, an output stage T2, a reset stage T3 and a noise reduction stage T4.

The frame reset stage T0: a high level signal is input to the reset signal terminal Trst, so that the fourth transistor M4 and the seventh transistor M7 are turned on, and a low level signal at the low level signal terminal VGL pulls down the output of the signal output terminal Output through the fourth transistor M4, and pulls down the potential at the pull-up node PU through the seventh transistor M7, so that the noise of the signal output terminal Output and the pull-up node PU is effectively prevented from affecting the display of the next frame of picture.

The precharge stage T1: a high level signal is input to the first input signal terminal Input1, so that the first transistor M1 is turned on, and the pull-up node PU is precharged by the high level signal at the first input signal terminal Input1; and the sixteenth transistor M16 is turned on, and the potential at the pull-down node PD is pulled down by a low level signal at the level signal terminal, so that the potential at the pull-up node PU is effectively prevented from being influenced by leakage of the tenth transistor M10.

The output stage T2: a low level signal is written into the first input signal terminal Input1, so that the first transistor M1 is turned off, and the pull-up node PU keeps the high level potential of the precharge stage T1; at this time, the third transistor M3 is turned on, a high level signal is input to the clock signal terminal CLK, and the pull-up node PU is amplified due to a bootstrapping voltage of the storage capacitor C1, so as to ensure that the third transistor M3 is continuously turned on, so that the signal output terminal Output outputs a high level signal.

The reset stage T3: a reset signal (i.e., a high level signal) is written into the second input signal terminal Input2, so that the second transistor M2 is turned on, and the potential at the pull-up node PU is pulled down and reset by a low level signal at the low level signal terminal VGL.

The noise reduction stage T4: the pull-up node PU is pulled down to the low level potential during the reset stage T3; and the fifth transistor M5 is always controlled by the first power voltage written into the first power voltage terminal VDD, so that the potential at the pull-down node PD is a high level signal, the tenth transistor M10 and the eleventh transistor M11 are turned on, a low level signal written into the low level signal terminal VGL denoises the output of the pull-up node PU through the tenth transistor M10, and denoises the output of the signal output terminal Output through the eleventh transistor M11.

The shift register repeats the noise reduction stage T4 until the next frame of picture arrives, thereby denoising the shift register continually. The blank stage is between the end of the display of the frame of picture and the beginning of the next frame of picture.

Figure 5:
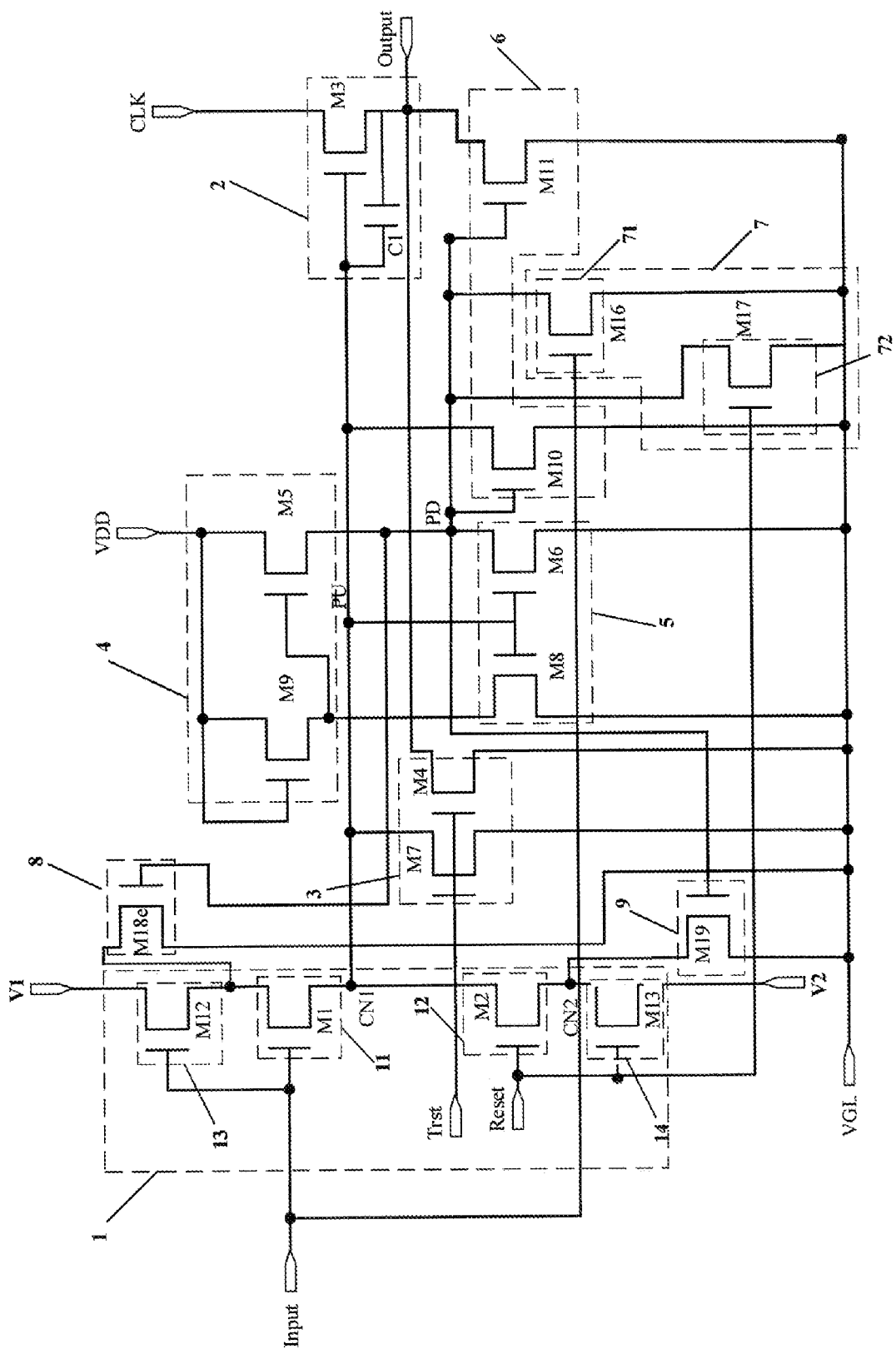
FIG. 5 is a circuit diagram of another shift register according to an embodiment of the present disclosure.

In another example, FIG. 5 is a schematic of a circuit of another shift register of an embodiment of the present disclosure. As shown in FIG. 5, the shift register may implement the bidirectional scanning, and includes the input circuit 1, the output circuit 2, a frame reset circuit 3, the pull-down control circuit 4, the pull-down circuit 5, the first noise reduction circuit 6, and the first auxiliary circuit 7. The number of each of the pull-down control circuit 4, the pull-down circuit 5, the first noise reduction circuit 6 and the first auxiliary circuit 7 is 2; the input circuit 1 includes the first input sub-circuit 11 and the second output sub-circuit; the first auxiliary circuit 7 includes the first auxiliary sub-circuit 71 and the second auxiliary sub-circuit 72; the first input sub-circuit 11 includes the first transistor M1, the second input sub-circuit 12 includes the second transistor M2; the output circuit 2 includes a third transistor M3 and a storage capacitor C1; the frame reset circuit 3 includes a fourth transistor M4 and a seventh transistor M7; each pull-down control circuit 4 includes a fifth transistor M5 and a ninth transistor M9, the fifth transistors M5 in the 1st and 2nd pull-down control circuits 4 are denoted by M5e and M5o, respectively, and the ninth transistors M9 are denoted by M9e and M9o, respectively; each pull-down circuit 5 includes a sixth transistor M6 and an eighth transistor M8, the sixth transistors M6 in the 1st and 2nd pull-down circuits 5 are denoted by M6e and M6o, respectively, and the eighth transistors M8 are denoted by M8e and M8o, respectively; each first noise reduction circuit 6 includes a tenth transistor M10 and an eleventh transistor M11, the tenth transistors M10 in the 1st and 2nd first noise reduction circuits 6 are denoted by M10e and M10o, respectively, and the eleventh transistors M11 are denoted by M11e and M11o, respectively; each first auxiliary sub-circuit 71 includes a sixteenth transistor M16, the sixteenth transistors M16 in the 1st and 2nd first auxiliary sub-circuits 71 are denoted by M16e and M16o, respectively; each second auxiliary sub-circuit 72 includes a seventeenth transistor M17, wherein the seventeenth transistors M17 in the 1st and 2nd second auxiliary sub-circuits 72 are denoted by M17e and M17o, respectively. The first power voltage terminals VDD to which the 1st and 2nd pull-down control circuits 4 are connected are denoted by VDDe and VDDo, respectively. In addition, the 1st pull-down control circuit 4 is connected to the 1st pull-down circuit 5, and a connection node therebetween is represented by a pull-down node PDe; the 2nd pull-down control circuit 4 is connected to the 2nd pull-down circuit 5, and a connection node therebetween is represented by a pull-down node PDo; the 1st first noise reduction circuit 6 is connected to PDe, the 2nd first noise reduction circuit 6 is connected to PDo; the 1st first auxiliary sub-circuit 71 and the 1st second auxiliary sub-circuit 72 are connected to PDe; the 2nd first auxiliary sub-circuit 71 and the 2nd second auxiliary sub-circuit 72 are connected to PDo.

With continued reference to FIG. 5, a source electrode of the first transistor M1 is connected to a first voltage terminal, a drain electrode of the first transistor M1 is connected to the pull-up node PU, and a gate electrode of the first transistor M1 is connected to the first input signal terminal Input1; a source electrode of the second transistor M2 is connected to the pull-up node PU, a drain electrode of the second transistor M2 is connected to the low level signal terminal VGL, and a gate electrode of the second transistor M2 is connected to the second input signal terminal Input2. A source electrode of the third transistor M3 is connected to a clock signal terminal CLK, a drain electrode of the third transistor M3 is connected to the signal output terminal Output, and a gate electrode of the third transistor M3 is connected to the pull-up node PU; a first plate of the storage capacitor C1 is connected to the pull-up node PU, and a second plate of the storage capacitor C1 is connected to the signal output terminal Output. A source electrode of the fourth transistor M4 is connected to the signal output terminal Output, a drain electrode of the fourth transistor M4 is connected to the low level signal terminal VGL, and a gate electrode of the fourth transistor M4 is connected to a reset signal terminal Trst; a source electrode of the seventh transistor M7 is connected to the pull-up node PU, a drain electrode of the seventh transistor M7 is connected to the low level signal terminal VGL, and a gate electrode of the seventh transistor M7 is connected to the reset signal terminal Trst. A source electrode of the fifth transistor M5e is connected to the first power voltage terminal VDDe, a drain electrode of the fifth transistor M5e is connected to the pull-down node PDe, and a gate electrode of the fifth transistor M5e is connected to a drain electrode of the ninth transistor M9e; source and gate electrodes of the ninth transistor M9e are connected to the first power voltage terminal VDDe; a source electrode of the fifth transistor M5o is connected to the first power voltage terminal VDDo, a drain electrode of the fifth transistor M5o is connected to the pull-down node PDo, and a gate electrode of the fifth transistor M5o is connected to a drain electrode of the ninth transistor M9o; source and gate electrodes of the ninth transistor M9o are connected to the first power voltage terminal VDDo; a source electrode of the sixth transistor M6e is connected to the pull-down node PDe, a drain electrode of the sixth transistor M6e is connected to the low level signal terminal VGL, and a gate electrode of the sixth transistor M6e is connected to the pull-up node PU; a source electrode of the eighth transistor M8e is connected to the drain electrode of the ninth transistor M9e and the gate electrode of the fifth transistor M5e, a drain electrode of the eighth transistor M8e is connected to the low level signal terminal VGL, and a gate electrode of the eighth transistor M8e is connected to the pull-up node PU; a source electrode of the sixth transistor M6o is connected to the pull-down node PDo, a drain electrode of the sixth transistor M6o is connected to the low level signal terminal VGL, and a gate electrode of the sixth transistor M6o is connected to the pull-up node PU. A source electrode of the eighth transistor M8o is connected to the drain electrode of the ninth transistor M9o and the gate electrode of the fifth transistor M5o, a drain electrode of the eighth transistor M8o is connected to the low level signal terminal VGL, and a gate electrode of the eighth transistor M8o is connected to the pull-up node PU; a source electrode of the tenth transistor M10e is connected to the pull-down node PU, a drain electrode of the tenth transistor M10e is connected to the low level signal terminal VGL, and a gate electrode of the tenth transistor M10e is connected to the pull-down node PDe; a source electrode of the eleventh transistor M11e is connected to the signal output terminal Output, a drain electrode of the eleventh transistor M11e is connected to the low level signal terminal VGL, and a gate electrode of the eleventh transistor M11e is connected to the pull-down node PDe; a source electrode of the tenth transistor M10o is connected to the pull-down node PU, a drain electrode of the tenth transistor M10o is connected to the low level signal terminal VGL, and a gate electrode of the tenth transistor M10o is connected to the pull-down node PDo; a source electrode of the eleventh transistor M11o is connected to the signal output terminal Output, a drain electrode of the eleventh transistor M11o is connected to the low level signal terminal VGL, and a gate electrode of the eleventh transistor M11o is connected to the pull-down node Pdo. A source electrode of the sixteenth transistor M16e is connected to the pull-down node PDe, a drain electrode of the sixteenth transistor M16e is connected to the low level signal terminal VGL, and a gate electrode of the sixteenth transistor M16e is connected to the first input signal terminal Input1; a source electrode of the sixteenth transistor M16o is connected to the pull-down node PDo, a drain electrode of the sixteenth transistor M16o is connected to the low level signal terminal VGL, and a gate electrode of the sixteenth transistor M16o is connected to the first input signal terminal Input1. A source electrode of the seventeenth transistor M17e is connected to the pull-down node PDe, a drain electrode of the seventeenth transistor M17e is connected to the low level signal terminal VGL, a gate electrode of the seventeenth transistor M17e is connected to the second input signal terminal. A source electrode of the seventeenth transistor M17o is connected to the pull-down node PDo, a drain electrode of the seventeenth transistor M17o is connected to the low level signal terminal VGL, and a gate electrode of the seventeenth transistor M17o is connected to the second input signal terminal.

It should be noted that in the scanning process of one frame of picture, the 1st pull-down control circuit 4, the 1st first pull-down circuit 5, the 1st first noise reduction circuit 6, the 1st first auxiliary sub-circuit 71, and the 1st second auxiliary sub-circuit 72 operate, or the 2nd pull-down control circuit 4, the 2nd first pull-down circuit 5, the 2nd first noise reduction circuit 6, the 2nd first auxiliary sub-circuit 71, and the 2nd second auxiliary sub-circuit 72 operate. That is, for each of the pull-down control circuits 4 (which are the same functional circuit), the pull-down circuits 5 (which are the same functional circuit), the first noise reduction circuits 6 (which are the same functional circuit), and the first auxiliary circuits 7 (which are the same functional circuit), only one of the same functional circuits operates when scanning one frame of picture, and when the operation is preset, it may be switched to a case where the other one of the same functional circuits operates, so that the life of the shift register may be prolonged. In the following description, only the 1st pull-down control circuit 4, the 1st first pull-down circuit 5, the 1st first noise reduction circuit 6, the 1st first auxiliary sub-circuit 71, and the 1st second auxiliary sub-circuit 72 operate, as an example.

FIG. 2 is a timing diagram of an operation of a shift register. Referring to FIGS. 2 and 5, a driving method for the shift register includes a display stage and a blank stage for displaying one frame of picture. The blank stage includes a frame reset stage T0; the display stage includes a precharge stage T1, an output stage T2, a reset stage T3 and a noise reduction stage T4.

The frame reset stage T0: a high level signal is input to the reset signal terminal Trst, so that the fourth transistor M4 and the seventh transistor M7 are turned on, and a low level signal at the low level signal terminal VGL pulls down the output of the signal output terminal Output through the fourth transistor M4, and pulls down the potential at the pull-up node PU through the seventh transistor M7, so that the noise of the signal output terminal Output and the pull-up node PU is effectively prevented from affecting the display of the next frame of picture.

The precharge stage T1: a high level signal is input to the first input signal terminal Input1, so that the first transistor M1 is turned on, and the pull-up node PU is precharged by the high level signal at the first input signal terminal Input1; and the sixteenth transistor is turned on, and the potential at the pull-down node PDe is pulled down by a low level signal at the level signal terminal, so that the potential at the pull-up node PU is effectively prevented from being influenced by leakage of the tenth transistor M10e.

The output stage T2: a low level signal is written into the first input signal terminal Input1, so that the first transistor M1 is turned off, and the pull-up node PU keeps the high level potential of the precharge stage T1; at this time, the third transistor M3 is turned on, a high level signal is input to the clock signal terminal CLK, and the pull-up node PU is amplified due to a bootstrapping voltage of the storage capacitor C1, so as to ensure that the third transistor M3 is continuously turned on, so that the signal output terminal Output outputs a high level signal.

The reset stage T3: a reset signal (i.e., a high level signal) is written into the second input signal terminal Input2, so that the second transistor M2 is turned on, and the potential at the pull-up node PU is pulled down and reset by a low level signal at the low level signal terminal VGL.

The noise reduction stage T4: the pull-up node PU is pulled down to the low level potential during the reset stage T3; and the fifth transistor M5e and the ninth transistor M9e are always controlled by the first power voltage written into the first power voltage terminal VDDe, so that the potential at the pull-down node PDe is a high level signal, the tenth transistor M10e and the eleventh transistor M11e are turned on, a low level signal written into the low level signal terminal VGL denoises the output of the pull-up node PU through the tenth transistor M10e, and denoises the output of the signal output terminal Output through the eleventh transistor M11e.

The shift register repeats the noise reduction stage T4 until the next frame of picture arrives, thereby denoising the shift register continually. The blank stage is between the end of the display of the frame of picture and the beginning of the next frame of picture.

Figure 6:
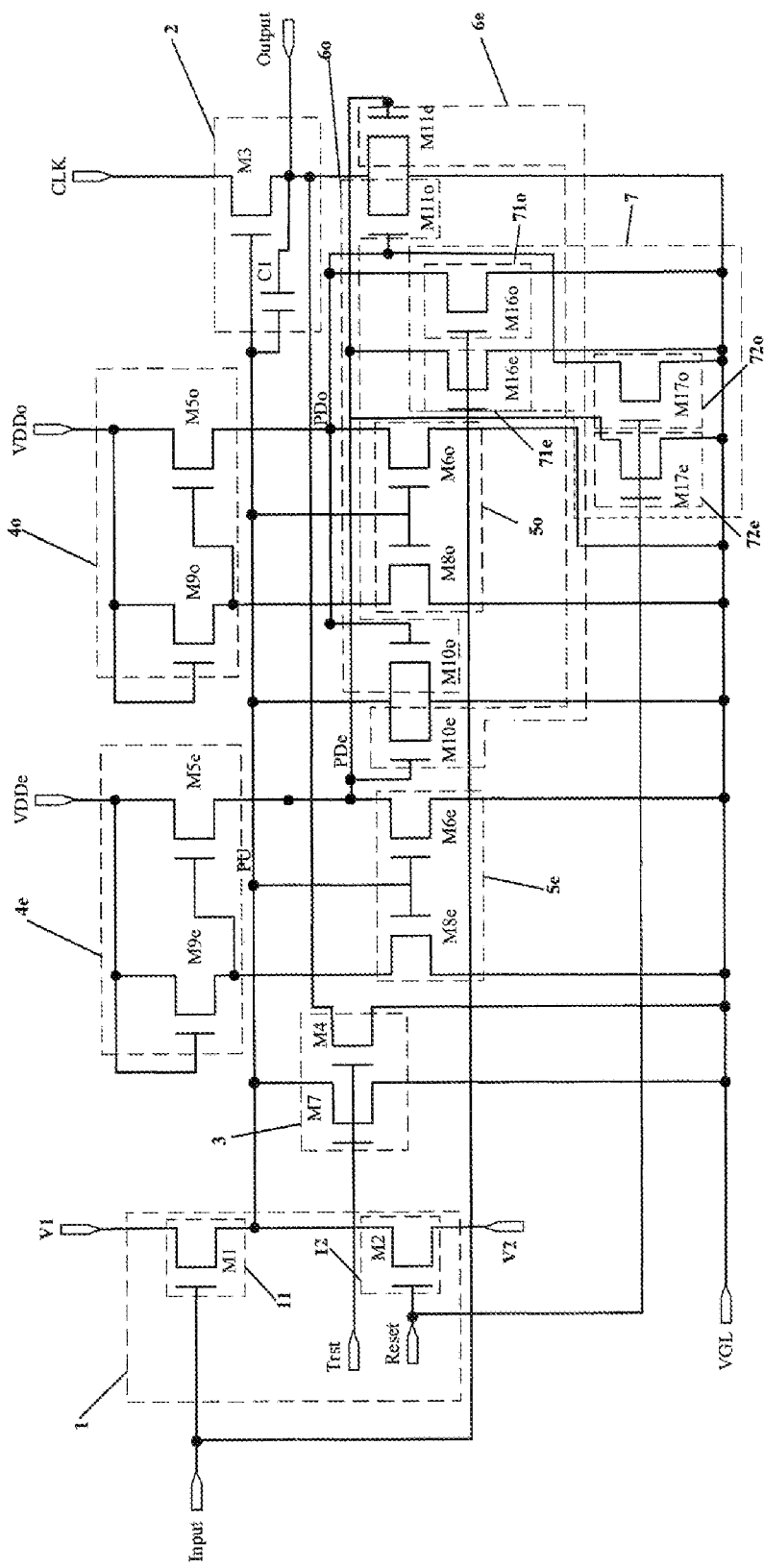
FIG. 6 is a circuit diagram of another shift register according to an embodiment of the present disclosure.

FIG. 6 is a diagram of a circuit of another shift register according to an embodiment of the present disclosure. As shown in FIG. 6, the shift register may implement the bidirectional scanning, and includes the input circuit 1, the output circuit 2, a frame reset circuit 3, the pull-down control circuit 4, the pull-down circuit 5, the first noise reduction circuit 6, a second noise reduction circuit 8, a third noise reduction circuit 9, and the first auxiliary circuit 7. The number of each of the pull-down control circuit 4, the pull-down circuit 5, the first noise reduction circuit 6, the second noise reduction circuit 8, the third noise reduction circuit 9, and the first auxiliary circuit 7 is 2. The input circuit 1 includes the first input sub-circuit 11, the second output sub-circuit, a first anticreep sub-circuit 13 and a second anticreep sub-circuit 14; the first auxiliary circuit 7 includes the first auxiliary sub-circuit 71 and the second auxiliary sub-circuit 72. The first input sub-circuit 11 includes the first transistor M1, the second input sub-circuit 12 includes the second transistor M2; the first anticreep sub-circuit 13 includes a twelfth transistor M12; the second anticreep sub-circuit 14 includes a thirteenth transistor M13; the output circuit 2 includes a third transistor M3 and a storage capacitor C1; the frame reset circuit 3 includes a fourth transistor M4 and a seventh transistor M7; each pull-down control circuit 4 includes a fifth transistor M5 and a ninth transistor M9, wherein the fifth transistors M5 in the 1st and 2nd pull-down control circuits 4 are denoted by M5$e$ and M5$o$, respectively, and the ninth transistors M9 are denoted by M9$e$ and M9$o$, respectively; each pull-down circuit 5 includes a sixth transistor M6 and an eighth transistor M8, wherein the sixth transistors M6 in the 1st and 2nd pull-down circuits 5 are denoted by M6$e$ and M6$o$, respectively, and the eighth transistors M8 are denoted by M8$e$ and M8$o$, respectively; each first noise reduction circuit 6 includes a tenth transistor M10 and an eleventh transistor M11, wherein the tenth transistors M10 in the 1st and 2nd first noise reduction circuits 6 are denoted by M10$e$ and M10$o$, respectively, and the eleventh transistors M11 are denoted by M11$e$ and M11$o$, respectively; each second noise reduction circuit 8 may include an eighteenth transistor M18, the eighteenth transistors M18 in the 1st and 2nd second noise reduction circuits 8$e$/8$o$ are denoted by M18$e$ and M18$o$, respectively; each third noise reduction circuit 9 may include a nineteenth transistor M19, the nineteenth transistors M19 in the 1st and 2nd third noise reduction circuits 9$e$/9$o$ are denoted by M19$e$ and M19$o$, respectively; each first auxiliary sub-circuit 71 includes a sixteenth transistor M16, wherein the sixteenth transistors M16 in the 1st and 2nd first auxiliary sub-circuits 71$e$/71$o$ are denoted by M16$e$ and M16$o$, respectively; each second auxiliary sub-circuit 72 includes a seventeenth transistor M17, wherein the seventeenth transistors M17 in the 1st and 2nd second auxiliary sub-circuits 72$e$/72$o$ are denoted by M17$e$ and M17$o$, respectively. The first power voltage terminals VDD to which the 1st and 2nd pull-down control circuits 4 are connected are denoted by VDD$e$ and VDD$o$, respectively. In addition, the 1st pull-down control circuit 4$e$ is connected to the 1st pull-down circuit 5$e$, and a connection node therebetween is represented by a pull-down node PD$e$; the 2nd pull-down control circuit 4$o$ is connected to the 2nd pull-down circuit 5$o$, and a connection node therebetween is represented by a pull-down node PD$o$; the 1st first noise reduction circuit 6$e$ is connected to PD$e$, the 2nd first noise reduction circuit 6$o$ is connected to PD$o$; the 1st first auxiliary sub-circuit 71 and the 1st second auxiliary sub-circuit 72 are connected to PD$e$; the 2nd first auxiliary sub-circuit 71 and the 2nd second auxiliary sub-circuit 72 are connected to PD$o$.

With continued reference to FIG. 6, a source electrode of the first transistor M1 is connected to a first connection node CN1, a drain electrode of the first transistor M1 is connected to the pull-up node PU, and a gate electrode of the first transistor M1 is connected to the first input signal terminal Input1; a source electrode of the second transistor M2 is connected to the pull-up node PU, a drain electrode of the second transistor M2 is connected to a second connection node CN2, and a gate electrode of the second transistor M2 is connected to the second input signal terminal Input2. A source electrode of the twelfth transistor M12 is connected to the first voltage terminal, a drain electrode of the twelfth transistor M12 is connected to the first connection node CN1, and a gate electrode of the twelfth transistor M12 is connected to the first input signal terminal Input1; a source electrode of the thirteenth transistor M13 is connected to the second voltage terminal, a drain electrode of the thirteenth transistor M13 is connected to the second input sub-circuit 12, and a gate electrode of the thirteenth transistor M13 is connected to the second connection node CN2. A source electrode of the third transistor M3 is connected to a clock signal terminal CLK, a drain electrode of the third transistor M3 is connected to the signal output terminal Output, and a gate electrode of the third transistor M3 is connected to the pull-up node PU; a first plate of the storage capacitor C1 is connected to the pull-up node PU, and a second plate of the storage capacitor C1 is connected to the signal output terminal Output. A source electrode of the fourth transistor M4 is connected to the signal output terminal Output, a drain electrode of the fourth transistor M4 is connected to the low level signal terminal VGL, and a gate electrode of the fourth transistor M4 is connected to a reset signal terminal Trst; a source electrode of the seventh transistor M7 is connected to the pull-up node PU, a drain electrode of the seventh transistor M7 is connected to the low level signal terminal VGL, and a gate electrode of the seventh transistor M7 is connected to the reset signal terminal Trst. A source electrode of the fifth transistor M5$e$ is connected to the first power voltage terminal VDD$e$, a drain electrode of the fifth transistor M5$e$ is connected to the pull-down node PD$e$, and a gate electrode of the fifth transistor M5$e$ is connected to a drain electrode of the ninth transistor M9$e$; source and gate electrodes of the ninth transistor M9$e$ are connected to the first power voltage terminal VDD$e$; a source electrode of the fifth transistor M5$o$ is connected to the first power voltage terminal VDD$o$, a drain electrode of the fifth transistor M5$o$ is connected to the pull-down node PD$o$, and a gate electrode of the fifth transistor M5$o$ is connected to a drain electrode of the ninth transistor M9$o$; source and gate electrodes of the ninth transistor M9$o$ are connected to the first power voltage terminal VDD$o$; a source electrode of the sixth transistor M6$e$ is connected to the pull-down node PD$e$, a drain electrode of the sixth transistor M6$e$ is connected to the low level signal terminal VGL, and a gate electrode of the sixth transistor M6$e$ is connected to the pull-up node PU; a source electrode of the eighth transistor M8$e$ is connected to the drain electrode of the ninth transistor M9$e$ and the gate electrode of the fifth transistor M5$e$, a drain electrode of the eighth transistor M8$e$ is connected to the low level signal terminal VGL, and a gate electrode of the eighth transistor M8$e$ is connected to the pull-up node PU; a source electrode of the sixth transistor M6$o$ is connected to the pull-down node PD$o$, a drain electrode of the sixth transistor M6$o$ is connected to the low level signal terminal VGL, and a gate electrode of the sixth transistor M6$o$ is connected to the pull-up node PU. A source electrode of the eighth transistor M8$o$ is connected to the drain electrode of the ninth transistor M9o and the gate electrode of the fifth transistor M5o, a drain electrode of the eighth transistor M8o is connected to the low level signal terminal VGL, and a gate electrode of the eighth transistor M8o is connected to the pull-up node PU; a source electrode of the tenth transistor M10e is connected to the pull-down node PU, a drain electrode of the tenth transistor M10e is connected to the low level signal terminal VGL, and a gate electrode of the tenth transistor M10e is connected to the pull-down node PDe; a source electrode of the eleventh transistor M11e is connected to the signal output terminal Output, a drain electrode of the eleventh transistor M11e is connected to the low level signal terminal VGL, and a gate electrode of the eleventh transistor M11e is connected to the pull-down node PDe; a source electrode of the tenth transistor M10o is connected to the pull-down node PU, a drain electrode of the tenth transistor M10o is connected to the low level signal terminal VGL, and a gate electrode of the tenth transistor M10o is connected to the pull-down node PDo; a source electrode of the eleventh transistor M11o is connected to the signal output terminal Output, a drain electrode of the eleventh transistor M11o is connected to the low level signal terminal VGL, and a gate electrode of the eleventh transistor M11o is connected to the pull-down node Pdo. A source electrode of the sixteenth transistor M16e is connected to the pull-down node PDe, a drain electrode of the sixteenth transistor M16e is connected to the low level signal terminal VGL, and a gate electrode of the sixteenth transistor M16e is connected to the first input signal terminal Input1; a source electrode of the sixteenth transistor M16o is connected to the pull-down node PDo, a drain electrode of the sixteenth transistor M16o is connected to the low level signal terminal VGL, and a gate electrode of the sixteenth transistor M16o is connected to the first input signal terminal Input1. A source electrode of the seventeenth transistor M17e is connected to the pull-down node PDe, a drain electrode of the seventeenth transistor M17e is connected to the low level signal terminal VGL, a gate electrode of the seventeenth transistor M17e is connected to the second input signal terminal. A source electrode of the seventeenth transistor M17o is connected to the pull-down node PDo, a drain electrode of the seventeenth transistor M17o is connected to the low level signal terminal VGL, and a gate electrode of the seventeenth transistor M17o is connected to the second input signal terminal. A source electrode of the eighteenth transistor M18e is connected to the first connection node CN1, a drain electrode of the eighteenth transistor M18e is connected to the low level signal terminal VGL, and a gate electrode of the eighteenth transistor M18o is connected to the pull-down node PDo; a source electrode of the eighteenth transistor M18o is connected to the first connection node CN1, a drain electrode of the eighteenth transistor M18o is connected to the low level signal terminal VGL, and a gate electrode of the eighteenth transistor M18o is connected to the pull-down node PDo; a source electrode of the nineteenth transistor M19e is connected to the second connection node CN2, a drain electrode of the nineteenth transistor M19e is connected to the low level signal terminal VGL, and a gate electrode of the nineteenth transistor M19e is connected to the pull-down node PDe; a source electrode of the nineteenth transistor M19o is connected to the second connection node CN2, a drain electrode of the nineteenth transistor M19o is connected to the low level signal terminal VGL, and a gate electrode of the nineteenth transistor M19o is connected to the pull-down node PDo.

It should be noted that in the scanning process of one frame of picture, the 1st pull-down control circuit 4, the 1st first pull-down circuit 5, the 1st first noise reduction circuit 6, the 1st second noise reduction circuit 8, the 1st third noise reduction circuit 9, the 1st first auxiliary sub-circuit 71, and the 1st second auxiliary sub-circuit 72 operate, or the 2nd pull-down control circuit 4, the 2nd first pull-down circuit 5, the 2nd first noise reduction circuit 6, the 2nd second noise reduction circuit 8, the 2nd third noise reduction circuit 9, the 2nd first auxiliary sub-circuit 71, and the 2nd second auxiliary sub-circuit 72 operate. That is, for each of the pull-down control circuits 4 (which are the same functional circuit), the pull-down circuits 5 (which are the same functional circuit), the first noise reduction circuits 6 (which are the same functional circuit), and the first auxiliary circuits 7 (which are the same functional circuit), only one of the same functional circuits operates when scanning one frame of picture, and when the operation is preset, it may be switched to a case where the other one of the same functional circuits operates, so that the life of the shift register may be prolonged. In the following description, only the 1st pull-down control circuit 4, the 1st first pull-down circuit 5, the 1st first noise reduction circuit 6, the 1st second noise reduction circuit 8, the 1st third noise reduction circuit 9, the 1st first auxiliary sub-circuit 71, and the 1st second auxiliary sub-circuit 72 operate, as an example.

FIG. 2 is a timing diagram of an operation of a shift register. Referring to FIGS. 2 and 6, a driving method for the shift register includes a display stage and a blank stage for displaying one frame of picture. The blank stage includes a frame reset stage T0; the display stage includes a precharge stage T1, an output stage T2, a reset stage T3 and a noise reduction stage T4.

The frame reset stage T0: a high level signal is input to the reset signal terminal Trst, so that the fourth transistor M4 and the seventh transistor M7 are turned on, and a low level signal at the low level signal terminal VGL pulls down the output of the signal output terminal Output through the fourth transistor M4, and pulls down the potential at the pull-up node PU through the seventh transistor M7, so that the noise of the signal output terminal Output and the pull-up node PU is effectively prevented from affecting the display of the next frame of picture.

The precharge stage T1: a high level signal is input to the first input signal terminal Input1, so that the first transistor M1 and the twelfth transistor M12 are turned on, and the pull-up node PU is precharged by the high level signal at the first input signal terminal Input1; and the sixteenth transistor is turned on, and the potential at the pull-down node PDe is pulled down by a low level signal at the level signal terminal, so that the potential at the pull-up node PU is effectively prevented from being influenced by leakage of the tenth transistor M10e.

The output stage T2: a low level signal is written into the first input signal terminal Input1, so that the first transistor M1 is turned off, and the pull-up node PU keeps the high level potential of the precharge stage T1; at this time, the third transistor M3 is turned on, a high level signal is input to the clock signal terminal CLK, and the pull-up node PU is amplified due to a bootstrapping voltage of the storage capacitor C1, so as to ensure that the third transistor M3 is continuously turned on, so that the signal output terminal Output outputs a high level signal.

The reset stage T3: a reset signal (i.e., a high level signal) is written into the second input signal terminal Input2, so that the second transistor M2 and the thirteenth transistor M13 are turned on, and the potential at the pull-up node PU is pulled down and reset by a low level signal at the low level signal terminal VGL.

The noise reduction stage T4: the pull-up node PU is pulled down to the low level potential during the reset stage T3; and the fifth transistor M5e and the ninth transistor M9e are always controlled by the first power voltage written into the first power voltage terminal VDDe, so that the potential at the pull-down node PDe is a high level signal, the tenth transistor M10e and the eleventh transistor M11e are turned on, a low level signal written into the low level signal terminal VGL denoises the output of the pull-up node PU through the tenth transistor M10e, and denoises the output of the signal output terminal Output through the eleventh transistor M11e. At the same time, the eighteenth transistor M18e is turned on, and an output of the first connection node CN1 is denoised.

The shift register repeats the noise reduction stage T4 until the next frame of picture arrives, thereby denoising the shift register continually. The blank stage is between the end of the display of the frame of picture and the beginning of the next frame of picture.

Figure 7:
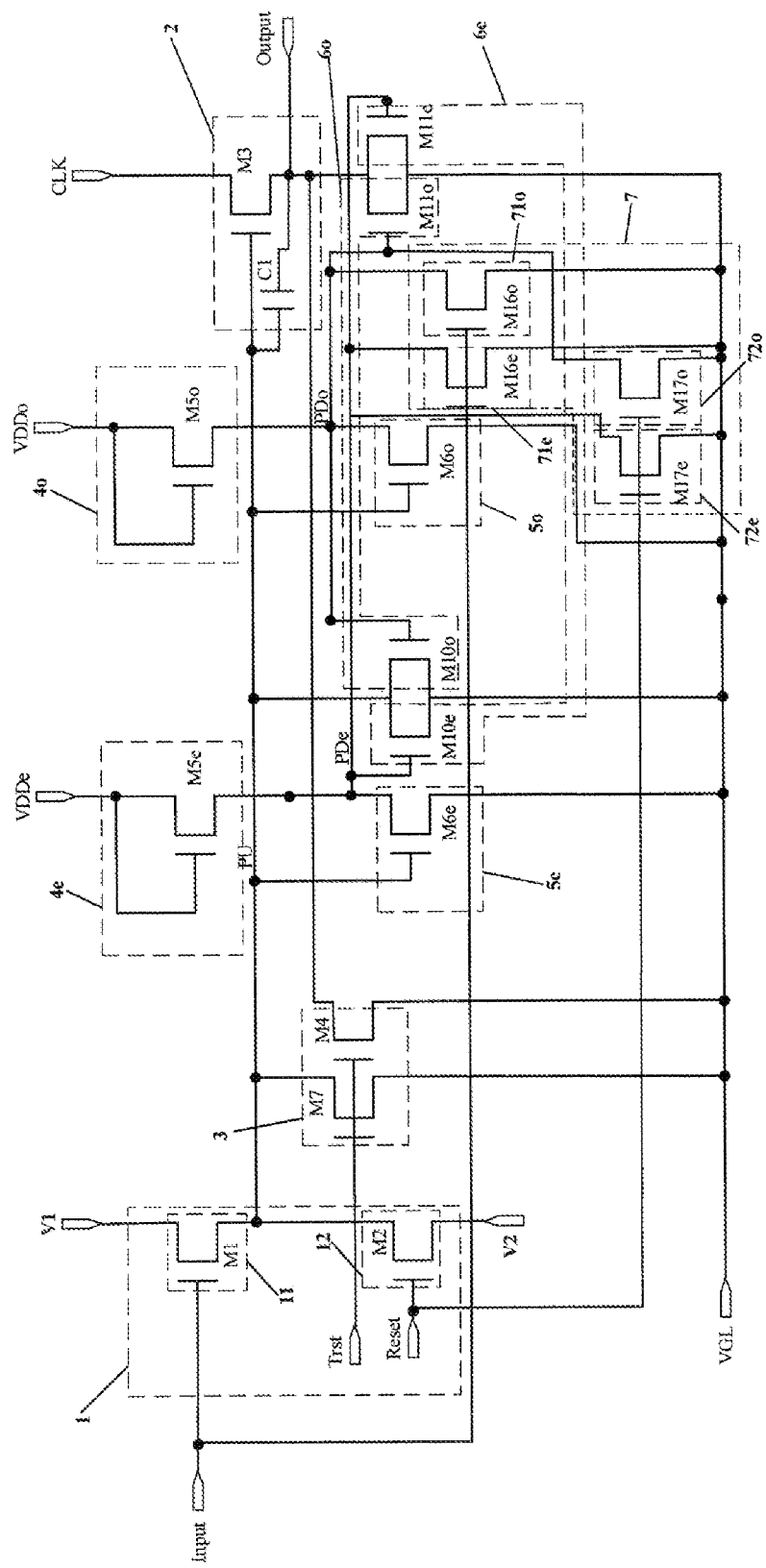
FIG. 7 is a circuit diagram of another shift register according to an embodiment of the present disclosure.

FIG. 7 is a diagram of a circuit of another shift register according to an embodiment of the present disclosure. As shown in FIG. 7, the shift register may implement the bidirectional scanning, and includes the input circuit 1, the output circuit 2, a frame reset circuit 3, the pull-down control circuit 4, the pull-down circuit 5, the first noise reduction circuit 6, a second noise reduction circuit 8, a third noise reduction circuit 9, and the first auxiliary circuit 7. The number of each of the pull-down control circuit 4, the pull-down circuit 5, the first noise reduction circuit 6, the second noise reduction circuit 8, the third noise reduction circuit 9, and the first auxiliary circuit 7 is 2. The input circuit 1 includes the first input sub-circuit 11, the second output sub-circuit, a first anticreep sub-circuit 13 and a second anticreep sub-circuit 14; the first auxiliary circuit 7 includes the first auxiliary sub-circuit 71 and the second auxiliary sub-circuit 72. The first input sub-circuit 11 includes the first transistor M1, the second input sub-circuit 12 includes the second transistor M2; the first anticreep sub-circuit 13 includes a twelfth transistor M12; the second anticreep sub-circuit 14 includes a thirteenth transistor M13; the output circuit 2 includes a third transistor M3 and a storage capacitor C1; the frame reset circuit 3 includes a fourth transistor M4 and a seventh transistor M7; each pull-down control circuit 4 includes a fifth transistor M5, wherein the fifth transistors M5 in the 1st and 2nd pull-down control circuits 4e/4o are denoted by M5e and M5o, respectively; each pull-down circuit 5 includes a sixth transistor M6, wherein the sixth transistors M6 in the 1st and 2nd pull-down circuits 5e/5o are denoted by M6e and M6o, respectively; each first noise reduction circuit 6 includes a tenth transistor M10 and an eleventh transistor M11, wherein the tenth transistors M10 in the 1st and 2nd first noise reduction circuits 6e/6o are denoted by M10e and M10o, respectively, and the eleventh transistors M11 are denoted by M11e and M11o, respectively; each second noise reduction circuit 8 may include an eighteenth transistor M18, the eighteenth transistors M18 in the 1st and 2nd second noise reduction circuits 8e/8o are denoted by M18e and M18o, respectively; each third noise reduction circuit 9 may include a nineteenth transistor M19, the nineteenth transistors M19 in the 1st and 2nd third noise reduction circuits 9e/9o are denoted by M19e and M19o, respectively; each first auxiliary sub-circuit 71 includes a sixteenth transistor M16, wherein the sixteenth transistors M16 in the 1st and 2nd first auxiliary sub-circuits 71e/71o are denoted by M16e and M16o, respectively; each second auxiliary sub-circuit 72 includes a seventeenth transistor M17, wherein the seventeenth transistors M17 in the 1st and 2nd second auxiliary sub-circuits 72e/72o are denoted by M17e and M17o, respectively. The first power voltage terminals VDD to which the 1st and 2nd pull-down control circuits 4 are connected are denoted by VDDe and VDDo, respectively. In addition, the 1st pull-down control circuit 4 is connected to the 1st pull-down circuit 5, and a connection node therebetween is represented by a pull-down node PDe; the 2nd pull-down control circuit 4 is connected to the 2nd pull-down circuit 5, and a connection node therebetween is represented by a pull-down node PDo; the 1st first noise reduction circuit 6 is connected to PDe, the 2nd first noise reduction circuit 6 is connected to PDo; the 1st first auxiliary sub-circuit 71 and the 1st second auxiliary sub-circuit 72 are connected to PDe; the 2nd first auxiliary sub-circuit 71 and the 2nd second auxiliary sub-circuit 72 are connected to PDo.

With continued reference to FIG. 7, a source electrode of the first transistor M1 is connected to a first connection node CN1, a drain electrode of the first transistor M1 is connected to the pull-up node PU, and a gate electrode of the first transistor M1 is connected to the first input signal terminal Input1; a source electrode of the second transistor M2 is connected to the pull-up node PU, a drain electrode of the second transistor M2 is connected to a second connection node CN2, and a gate electrode of the second transistor M2 is connected to the second input signal terminal Input2. A source electrode of the twelfth transistor M12 is connected to the first voltage terminal, a drain electrode of the twelfth transistor M12 is connected to the first connection node CN1, and a gate electrode of the twelfth transistor M12 is connected to the first input signal terminal Input1; a source electrode of the thirteenth transistor M13 is connected to the second voltage terminal, a drain electrode of the thirteenth transistor M13 is connected to the second input sub-circuit 12, and a gate electrode of the thirteenth transistor M13 is connected to the second connection node CN2. A source electrode of the third transistor M3 is connected to a clock signal terminal CLK, a drain electrode of the third transistor M3 is connected to the signal output terminal Output, and a gate electrode of the third transistor M3 is connected to the pull-up node PU; a first plate of the storage capacitor C1 is connected to the pull-up node PU, and a second plate of the storage capacitor C1 is connected to the signal output terminal Output. A source electrode of the fourth transistor M4 is connected to the signal output terminal Output, a drain electrode of the fourth transistor M4 is connected to the low level signal terminal VGL, and a gate electrode of the fourth transistor M4 is connected to a reset signal terminal Trst; a source electrode of the seventh transistor M7 is connected to the pull-up node PU, a drain electrode of the seventh transistor M7 is connected to the low level signal terminal VGL, and a gate electrode of the seventh transistor M7 is connected to the reset signal terminal Trst. Source and gate electrodes of the fifth transistor M5e are connected to the first power voltage terminal VDDe, a drain electrode of the fifth transistor M5e is connected to the pull-down node PDe; Source and gate electrodes of the fifth transistor M5o are connected to the first power voltage terminal VDDo, a drain electrode of the fifth transistor M5o is connected to the pull-down node PDo; a source electrode of the sixth transistor M6e is connected to the pull-down node PDe, a drain electrode of the sixth transistor M6e is connected to the low level signal terminal VGL, and a gate electrode of the sixth transistor M6e is connected to the pull-up node PU; a source electrode of the sixth transistor M6o is connected to the pull-down node PDo, a drain electrode of the sixth transistor M6o is connected to the low level signal terminal VGL, and a gate electrode of the sixth transistor M6o is connected to the pull-up node PU. A source electrode of the tenth transistor M10e is connected to the pull-down node PU, a drain electrode of the tenth transistor M10e is connected to the low level signal terminal VGL, and a gate electrode of the tenth transistor M10e is connected to the pull-down node PDe; a source electrode of the eleventh transistor M11e is connected to the signal output terminal Output, a drain electrode of the eleventh transistor M11e is connected to the low level signal terminal VGL, and a gate electrode of the eleventh transistor M11e is connected to the pull-down node PDe; a source electrode of the tenth transistor M10o is connected to the pull-down node PU, a drain electrode of the tenth transistor M10o is connected to the low level signal terminal VGL, and a gate electrode of the tenth transistor M10o is connected to the pull-down node PDo; a source electrode of the eleventh transistor M11o is connected to the signal output terminal Output, a drain electrode of the eleventh transistor M11o is connected to the low level signal terminal VGL, and a gate electrode of the eleventh transistor M11o is connected to the pull-down node Pdo. A source electrode of the sixteenth transistor M16e is connected to the pull-down node PDe, a drain electrode of the sixteenth transistor M16e is connected to the low level signal terminal VGL, and a gate electrode of the sixteenth transistor M16e is connected to the first input signal terminal Input1; a source electrode of the sixteenth transistor M16o is connected to the pull-down node PDo, a drain electrode of the sixteenth transistor M16o is connected to the low level signal terminal VGL, and a gate electrode of the sixteenth transistor M16o is connected to the first input signal terminal Input1. A source electrode of the seventeenth transistor M17e is connected to the pull-down node PDe, a drain electrode of the seventeenth transistor M17e is connected to the low level signal terminal VGL, a gate electrode of the seventeenth transistor M17e is connected to the second input signal terminal. A source electrode of the seventeenth transistor M17o is connected to the pull-down node PDo, a drain electrode of the seventeenth transistor M17o is connected to the low level signal terminal VGL, and a gate electrode of the seventeenth transistor M17o is connected to the second input signal terminal. A source electrode of the eighteenth transistor M18e is connected to the first connection node CN1, a drain electrode of the eighteenth transistor M18e is connected to the low level signal terminal VGL, and a gate electrode of the eighteenth transistor M18o is connected to the pull-down node PDo; a source electrode of the eighteenth transistor M18o is connected to the first connection node CN1, a drain electrode of the eighteenth transistor M18o is connected to the low level signal terminal VGL, and a gate electrode of the eighteenth transistor M18o is connected to the pull-down node PDo; a source electrode of the nineteenth transistor M19e is connected to the second connection node CN2, a drain electrode of the nineteenth transistor M19e is connected to the low level signal terminal VGL, and a gate electrode of the nineteenth transistor M19e is connected to the pull-down node PDe; a source electrode of the nineteenth transistor M19o is connected to the second connection node CN2, a drain electrode of the nineteenth transistor M19o is connected to the low level signal terminal VGL, and a gate electrode of the nineteenth transistor M19o is connected to the pull-down node PDo.

It should be noted that in the scanning process of one frame of picture, the 1st pull-down control circuit 4, the 1st first pull-down circuit 5, the 1st first noise reduction circuit 6, the 1st second noise reduction circuit 8, the 1st third noise reduction circuit 9, the 1st first auxiliary sub-circuit 71, and the 1st second auxiliary sub-circuit 72 operate, or the 2nd pull-down control circuit 4, the 2nd first pull-down circuit 5, the 2nd first noise reduction circuit 6, the 2nd second noise reduction circuit 8, the 2nd third noise reduction circuit 9, the 2nd first auxiliary sub-circuit 71, and the 2nd second auxiliary sub-circuit 72 operate. That is, for each of the pull-down control circuits 4 (which are the same functional circuit), the pull-down circuits 5 (which are the same functional circuit), the first noise reduction circuits 6 (which are the same functional circuit), and the first auxiliary circuits 7 (which are the same functional circuit), only one of the same functional circuits operates when scanning one frame of picture, and when the operation is preset, it may be switched to a case where the other one of the same functional circuits operates, so that the life of the shift register may be prolonged. In the following description, only the 1st pull-down control circuit 4, the 1st first pull-down circuit 5, the 1st first noise reduction circuit 6, the 1st second noise reduction circuit 8, the 1st third noise reduction circuit 9, the 1st first auxiliary sub-circuit 71, and the 1st second auxiliary sub-circuit 72 operate, as an example.

FIG. 2 is a timing diagram of an operation of a shift register. Referring to FIGS. 2 and 7, a driving method for the shift register includes a display stage and a blank stage for displaying one frame of picture. The blank stage includes a frame reset stage T0; the display stage includes a precharge stage T1, an output stage T2, a reset stage T3 and a noise reduction stage T4.

The frame reset stage T0: a high level signal is input to the reset signal terminal Trst, so that the fourth transistor M4 and the seventh transistor M7 are turned on, and a low level signal at the low level signal terminal VGL pulls down the output of the signal output terminal Output through the fourth transistor M4, and pulls down the potential at the pull-up node PU through the seventh transistor M7, so that the noise of the signal output terminal Output and the pull-up node PU is effectively prevented from affecting the display of the next frame of picture.

The precharge stage T1: a high level signal is input to the first input signal terminal Input1, so that the first transistor M1 and the twelfth transistor M12 are turned on, and the pull-up node PU is precharged by the high level signal at the first input signal terminal Input1; and the sixteenth transistor is turned on, and the potential at the pull-down node PDe is pulled down by a low level signal at the level signal terminal, so that the potential at the pull-up node PU is effectively prevented from being influenced by leakage of the tenth transistor M10e.

The output stage T2: a low level signal is written into the first input signal terminal Input1, so that the first transistor M1 is turned off, and the pull-up node PU keeps the high level potential of the precharge stage T1; at this time, the third transistor M3 is turned on, a high level signal is input to the clock signal terminal CLK, and the pull-up node PU is amplified due to a bootstrapping voltage of the storage capacitor C1, so as to ensure that the third transistor M3 is continuously turned on, so that the signal output terminal Output outputs a high level signal.

The reset stage T3: a reset signal (i.e., a high level signal) is written into the second input signal terminal Input2, so that the second transistor M2 and the thirteenth transistor M13 are turned on, and the potential at the pull-up node PU is pulled down and reset by a low level signal at the low level signal terminal VGL.

The noise reduction stage T4: the pull-up node PU is pulled down to the low level potential during the reset stage T3; and the fifth transistor M5e is always controlled by the first power voltage written into the first power voltage terminal VDDe, so that the potential at the pull-down node PDe is a high level signal, the tenth transistor M10e and the eleventh transistor M11e are turned on, a low level signal written into the low level signal terminal VGL denoises the output of the pull-up node PU through the tenth transistor M10e, and denoises the output of the signal output terminal Output through the eleventh transistor M11e. At the same time, the eighteenth transistor M18e is turned on, and an output of the first connection node CN1 is denoised.

The shift register repeats the noise reduction stage T4 until the next frame of picture arrives, thereby denoising the shift register continually. The blank stage is between the end of the display of the frame of picture and the beginning of the next frame of picture.

Figure 8:
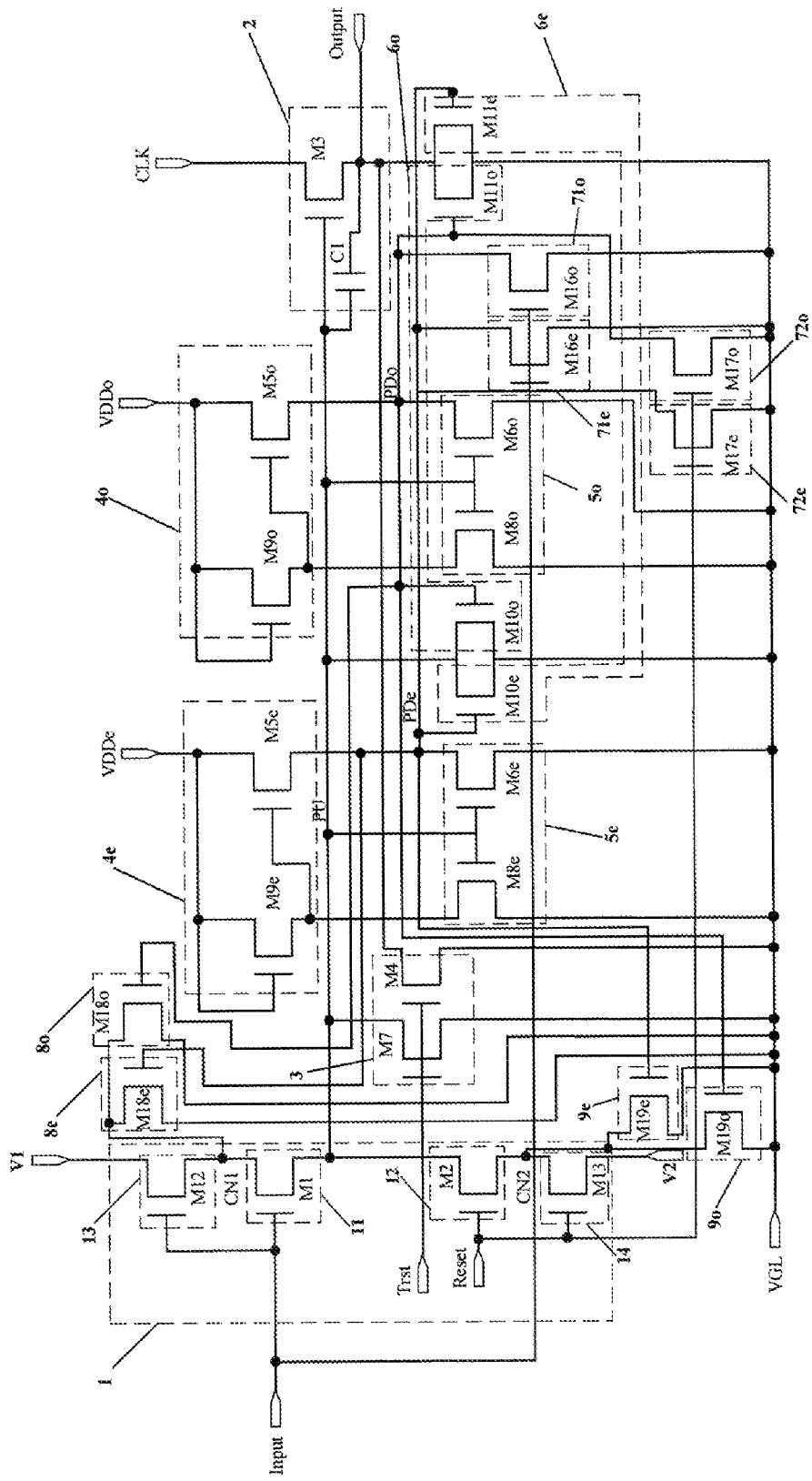
FIG. 8 is a circuit diagram of another shift register according to an embodiment of the present disclosure.

In another example, FIG. 8 is a schematic diagram of a circuit of another shift register of an embodiment of the present disclosure. As shown in FIG. 8, the shift register may implement the bidirectional scanning, and includes the input circuit 1, the output circuit 2, a frame reset circuit 3, the pull-down control circuit 4, the pull-down circuit 5, the first noise reduction circuit 6, a second noise reduction circuit 8, a third noise reduction circuit 9, and the first auxiliary circuit 7. The number of each of the pull-down control circuit 4, the pull-down circuit 5, the first noise reduction circuit 6, and the first auxiliary circuit 7 is 1. The input circuit 1 includes the first input sub-circuit 11, the second output sub-circuit, a first anticreep sub-circuit 13 and a second anticreep sub-circuit 14; the first anticreep sub-circuit 13 includes a twelfth transistor M12; the second anticreep sub-circuit 14 includes a thirteenth transistor M13; the first auxiliary circuit 7 includes the first auxiliary sub-circuit 71 and the second auxiliary sub-circuit 72. The first input sub-circuit 11 includes the first transistor M1, the second input sub-circuit 12 includes the second transistor M2; the output circuit 2 includes a third transistor M3 and a storage capacitor C1; the frame reset circuit 3 includes a fourth transistor M4 and a seventh transistor M7; the pull-down control circuit 4 includes a fifth transistor M5; the pull-down circuit 5 includes a sixth transistor M6; the first noise reduction circuit 6 includes a tenth transistor M10 and an eleventh transistor M11; the first auxiliary sub-circuit 71 includes a sixteenth transistor M16; the second auxiliary sub-circuit 72 includes a seventeenth transistor M17; the second noise reduction circuit 8 may include an eighteenth transistor M18; the third noise reduction circuit 9 may include a nineteenth transistor M19.

With continued reference to FIG. 8, a source electrode of the first transistor M1 is connected to a first connection node CN1, a drain electrode of the first transistor M1 is connected to the pull-up node PU, and a gate electrode of the first transistor M1 is connected to the first input signal terminal Input1; a source electrode of the second transistor M2 is connected to the pull-up node PU, a drain electrode of the second transistor M2 is connected to a second connection node CN2, and a gate electrode of the second transistor M2 is connected to the second input signal terminal Input2. A source electrode of the twelfth transistor M12 is connected to the first voltage terminal, a drain electrode of the twelfth transistor M12 is connected to the first connection node CN1, and a gate electrode of the twelfth transistor M12 is connected to the first input signal terminal Input1; a source electrode of the thirteenth transistor M13 is connected to the second voltage terminal, a drain electrode of the thirteenth transistor M13 is connected to the second connection node CN2, and a gate electrode of the thirteenth transistor M13 is connected to the second input signal terminal Input2. A source electrode of the third transistor M3 is connected to a clock signal terminal CLK, a drain electrode of the third transistor M3 is connected to the signal output terminal Output, and a gate electrode of the third transistor M3 is connected to the pull-up node PU; a first plate of the storage capacitor C1 is connected to the pull-up node PU, and a second plate of the storage capacitor C1 is connected to the signal output terminal Output. A source electrode of the fourth transistor M4 is connected to the signal output terminal Output, a drain electrode of the fourth transistor M4 is connected to the low level signal terminal VGL, and a gate electrode of the fourth transistor M4 is connected to a reset signal terminal Trst; a source electrode of the seventh transistor M7 is connected to the pull-up node PU, a drain electrode of the seventh transistor M7 is connected to the low level signal terminal VGL, and a gate electrode of the seventh transistor M7 is connected to the reset signal terminal Trst. Source and gate electrodes of the fifth transistor M5 are connected to the first power voltage terminal VDD, a drain electrode of the fifth transistor M5 is connected to the pull-down node PD; a source electrode of the sixth transistor M6 is connected to the pull-down node PD, a drain electrode of the sixth transistor M6 is connected to the low level signal terminal VGL, and a gate electrode of the sixth transistor M6 is connected to the pull-up node PU. A source electrode of the tenth transistor M10 is connected to the pull-down node PU, a drain electrode of the tenth transistor M10 is connected to the low level signal terminal VGL, and a gate electrode of the tenth transistor M10 is connected to the pull-down node PD; a source electrode of the eleventh transistor M11 is connected to the signal output terminal Output, a drain electrode of the eleventh transistor M11 is connected to the low level signal terminal VGL, and a gate electrode of the eleventh transistor M11 is connected to the pull-down node PD. A source electrode of the sixteenth transistor M16 is connected to the pull-down node PD, a drain electrode of the sixteenth transistor M16 is connected to the low level signal terminal VGL, and a gate electrode of the sixteenth transistor M16 is connected to the first input signal terminal Input1. A source electrode of the seventeenth transistor M17 is connected to the pull-down node PD, a drain electrode of the seventeenth transistor M17 is connected to the low level signal terminal VGL, a gate electrode of the seventeenth transistor M17 is connected to the second input signal terminal. A source electrode of the eighteenth transistor M18 is connected to the first connection node CN1, a drain electrode of the eighteenth transistor M18 is connected to the low level signal terminal VGL, and a gate electrode of the eighteenth transistor M18 is connected to the pull-down node PD; a source electrode of the nineteenth transistor M19 is connected to the second connection node CN2, a drain electrode of the nineteenth transistor M19 is connected to the low level signal terminal VGL, and a gate electrode of the nineteenth transistor M19 is connected to the pull-down node PD.

FIG. 2 is a timing diagram of an operation of a shift register. Referring to FIGS. 2 and 8, a driving method for the shift register includes a display stage and a blank stage for displaying one frame of picture. The blank stage includes a frame reset stage T0; the display stage includes a precharge stage T1, an output stage T2, a reset stage T3 and a noise reduction stage T4.

The frame reset stage T0: a high level signal is input to the reset signal terminal Trst, so that the fourth transistor M4 and the seventh transistor M7 are turned on, and a low level signal at the low level signal terminal VGL pulls down the output of the signal output terminal Output through the fourth transistor M4, and pulls down the potential at the pull-up node PU through the seventh transistor M7, so that the noise of the signal output terminal Output and the pull-up node PU is effectively prevented from affecting the display of the next frame of picture.

The precharge stage T1: a high level signal is input to the first input signal terminal Input1, so that the first transistor M1 is turned on, and the pull-up node PU is precharged by the high level signal at the first input signal terminal Input1; and the sixteenth transistor M16 is turned on, and the potential at the pull-down node PD is pulled down by a low level signal at the level signal terminal, so that the potential at the pull-up node PU is effectively prevented from being influenced by leakage of the tenth transistor M10.

The output stage T2: a low level signal is written into the first input signal terminal Input1, so that the first transistor M1 is turned off, and the pull-up node PU keeps the high level potential of the precharge stage T1; at this time, the third transistor M3 is turned on, a high level signal is input to the clock signal terminal CLK, and the pull-up node PU is amplified due to a bootstrapping voltage of the storage capacitor C1, so as to ensure that the third transistor M3 is continuously turned on, so that the signal output terminal Output outputs a high level signal.

The reset stage T3: a reset signal (i.e., a high level signal) is written into the second input signal terminal Input2, so that the second transistor M2 is turned on, and the potential at the pull-up node PU is pulled down and reset by a low level signal at the low level signal terminal VGL.

The noise reduction stage T4: the pull-up node PU is pulled down to the low level potential during the reset stage T3; and the fifth transistor M5 is always controlled by the first power voltage written into the first power voltage terminal VDD, so that the potential at the pull-down node PD is a high level signal, the tenth transistor M10 and the eleventh transistor M11 are turned on, a low level signal written into the low level signal terminal VGL denoises the output of the pull-up node PU through the tenth transistor M10, and denoises the output of the signal output terminal Output through the eleventh transistor M11. At the same time, the eighteenth transistor M18 is turned on, and an output of the first connection node CN1 is denoised.

The shift register repeats the noise reduction stage T4 until the next frame of picture arrives, thereby denoising the shift register continually. The blank stage is between the end of the display of the frame of picture and the beginning of the next frame of picture.

Figure 9:
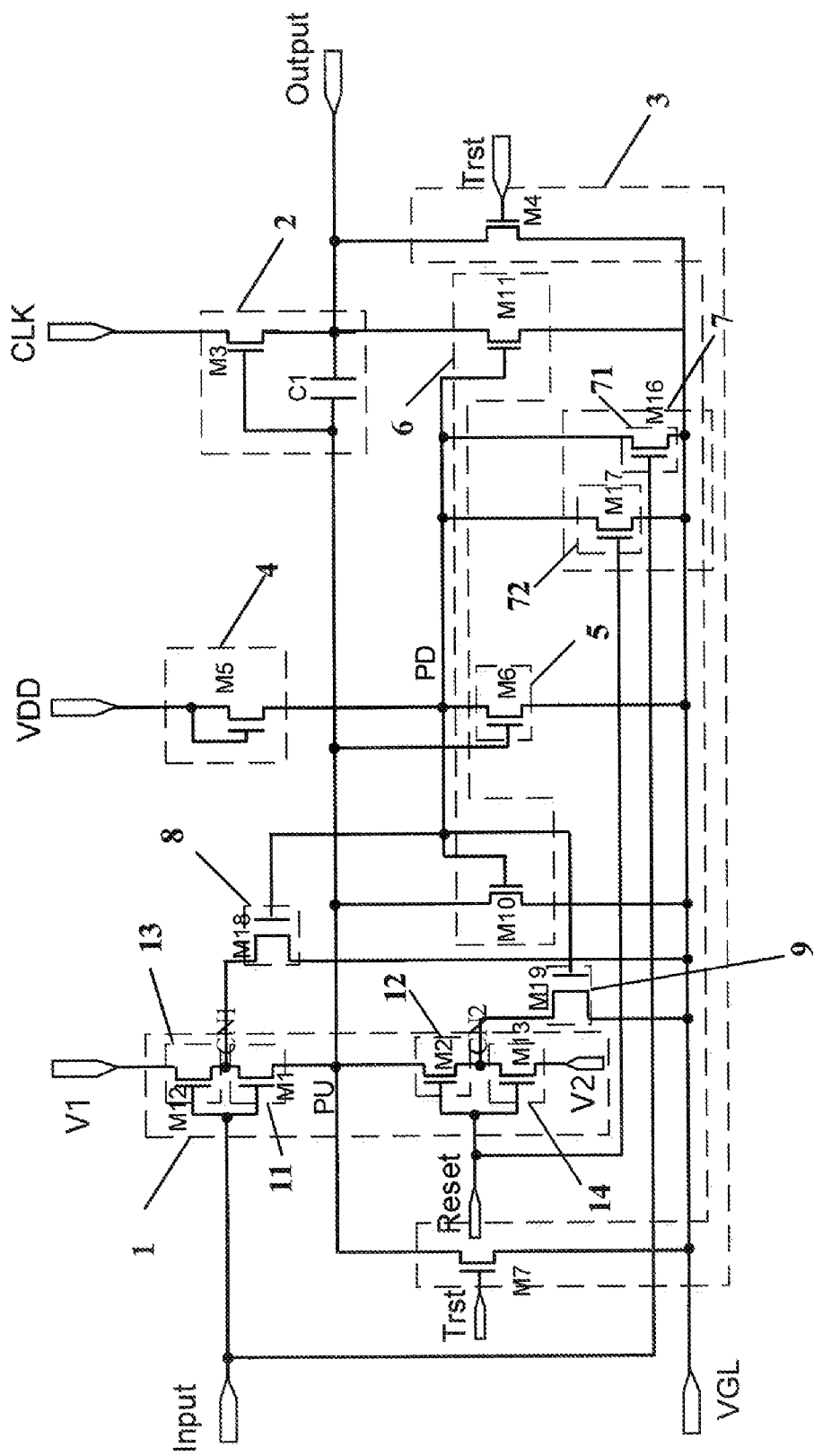
FIG. 9 is a circuit diagram of another shift register according to an embodiment of the present disclosure.

In another example, FIG. 9 is a schematic diagram of a circuit of another shift register of an embodiment of the present disclosure. As shown in FIG. 9, the shift register may implement the bidirectional scanning, and includes the input circuit 1, the output circuit 2, a frame reset circuit 3, the pull-down control circuit 4, the pull-down circuit 5, the first noise reduction circuit 6, a second noise reduction circuit 8, a third noise reduction circuit 9, and the first auxiliary circuit 7. The number of each of the pull-down control circuit 4, the pull-down circuit 5, the first noise reduction circuit 6, and the first auxiliary circuit 7 is 1. The input circuit 1 includes the first input sub-circuit 11, the second output sub-circuit, a first anticreep sub-circuit 13 and a second anticreep sub-circuit 14; the first anticreep sub-circuit 13 includes a twelfth transistor M12; the second anticreep sub-circuit 14 includes a thirteenth transistor M13; the first auxiliary circuit 7 includes the first auxiliary sub-circuit 71 and the second auxiliary sub-circuit 72. The first input sub-circuit 11 includes the first transistor M1, the second input sub-circuit 12 includes the second transistor M2; the output circuit 2 includes a third transistor M3 and a storage capacitor C1; the frame reset circuit 3 includes a fourth transistor M4 and a seventh transistor M7; the pull-down control circuit 4 includes a fifth transistor M5; the pull-down circuit 5 includes a sixth transistor M6; the first noise reduction circuit 6 includes a tenth transistor M10 and an eleventh transistor M11; the first auxiliary sub-circuit 71 includes a sixteenth transistor M16; the second auxiliary sub-circuit 72 includes a seventeenth transistor M17; the second noise reduction circuit 8 may include an eighteenth transistor M18; the third noise reduction circuit 9 may include a nineteenth transistor M19.

With continued reference to FIG. 9, a source electrode of the first transistor M1 is connected to a first connection node CN1, a drain electrode of the first transistor M1 is connected to the pull-up node PU, and a gate electrode of the first transistor M1 is connected to the first input signal terminal Input1; a source electrode of the second transistor M2 is connected to the pull-up node PU, a drain electrode of the second transistor M2 is connected to a second connection node CN2, and a gate electrode of the second transistor M2 is connected to the second input signal terminal Input2. A source electrode of the twelfth transistor M12 is connected to the first voltage terminal, a drain electrode of the twelfth transistor M12 is connected to the first connection node CN1, and a gate electrode of the twelfth transistor M12 is connected to the first input signal terminal Input1; a source electrode of the thirteenth transistor M13 is connected to the second voltage terminal, a drain electrode of the thirteenth transistor M13 is connected to the second connection node CN2, and a gate electrode of the thirteenth transistor M13 is connected to the second input signal terminal Input2. A source electrode of the third transistor M3 is connected to a clock signal terminal CLK, a drain electrode of the third transistor M3 is connected to the signal output terminal Output, and a gate electrode of the third transistor M3 is connected to the pull-up node PU; a first plate of the storage capacitor C1 is connected to the pull-up node PU, and a second plate of the storage capacitor C1 is connected to the signal output terminal Output. A source electrode of the fourth transistor M4 is connected to the signal output terminal Output, a drain electrode of the fourth transistor M4 is connected to the low level signal terminal VGL, and a gate electrode of the fourth transistor M4 is connected to a reset signal terminal Trst; a source electrode of the seventh transistor M7 is connected to the pull-up node PU, a drain electrode of the seventh transistor M7 is connected to the low level signal terminal VGL, and a gate electrode of the seventh transistor M7 is connected to the reset signal terminal Trst. Source and gate electrodes of the fifth transistor M5 are connected to the first power voltage terminal VDD, a drain electrode of the fifth transistor M5 is connected to the pull-down node PD; a source electrode of the sixth transistor M6 is connected to the pull-down node PD, a drain electrode of the sixth transistor M6 is connected to the low level signal terminal VGL, and a gate electrode of the sixth transistor M6 is connected to the pull-up node PU. A source electrode of the tenth transistor M10 is connected to the pull-down node PU, a drain electrode of the tenth transistor M10 is connected to the low level signal terminal VGL, and a gate electrode of the tenth transistor M10 is connected to the pull-down node PD; a source electrode of the eleventh transistor M11 is connected to the signal output terminal Output, a drain electrode of the eleventh transistor M11 is connected to the low level signal terminal VGL, and a gate electrode of the eleventh transistor M11 is connected to the pull-down node PD. A source electrode of the sixteenth transistor M16 is connected to the pull-down node PD, a drain electrode of the sixteenth transistor M16 is connected to the low level signal terminal VGL, and a gate electrode of the sixteenth transistor M16 is connected to the first input signal terminal Input1. A source electrode of the seventeenth transistor M17 is connected to the pull-down node PD, a drain electrode of the seventeenth transistor M17 is connected to the low level signal terminal VGL, a gate electrode of the seventeenth transistor M17 is connected to the second input signal terminal. A source electrode of the eighteenth transistor M18 is connected to the first connection node CN1, a drain electrode of the eighteenth transistor M18 is connected to the low level signal terminal VGL, and a gate electrode of the eighteenth transistor M18 is connected to the pull-down node PD; a source electrode of the nineteenth transistor M19 is connected to the second connection node CN2, a drain electrode of the nineteenth transistor M19 is connected to the low level signal terminal VGL, and a gate electrode of the nineteenth transistor M19 is connected to the pull-down node PD.

FIG. 2 is a timing diagram of an operation of a shift register. Referring to FIGS. 2 and 9, a driving method for the shift register includes a display stage and a blank stage for displaying one frame of picture. The blank stage includes a frame reset stage T0; the display stage includes a precharge stage T1, an output stage T2, a reset stage T3 and a noise reduction stage T4.

The frame reset stage T0: a high level signal is input to the reset signal terminal Trst, so that the fourth transistor M4 and the seventh transistor M7 are turned on, and a low level signal at the low level signal terminal VGL pulls down the output of the signal output terminal Output through the fourth transistor M4, and pulls down the potential at the pull-up node PU through the seventh transistor M7, so that the noise of the signal output terminal Output and the pull-up node PU is effectively prevented from affecting the display of the next frame of picture.

The precharge stage T1: a high level signal is input to the first input signal terminal Input1, so that the first transistor M1 is turned on, and the pull-up node PU is precharged by the high level signal at the first input signal terminal Input1; and the sixteenth transistor M16 is turned on, and the potential at the pull-down node PD is pulled down by a low level signal at the level signal terminal, so that the potential at the pull-up node PU is effectively prevented from being influenced by leakage of the tenth transistor M10.

The output stage T2: a low level signal is written into the first input signal terminal Input1, so that the first transistor M1 is turned off, and the pull-up node PU keeps the high level potential of the precharge stage T1; at this time, the third transistor M3 is turned on, a high level signal is input to the clock signal terminal CLK, and the pull-up node PU is amplified due to a bootstrapping voltage of the storage capacitor C1, so as to ensure that the third transistor M3 is continuously turned on, so that the signal output terminal Output outputs a high level signal.

The reset stage T3: a reset signal (i.e., a high level signal) is written into the second input signal terminal Input2, so that the second transistor M2 and the thirteenth transistor M13 are turned on, and the potential at the pull-up node PU is pulled down and reset by a low level signal at the low level signal terminal VGL.

The noise reduction stage T4: the pull-up node PU is pulled down to the low level potential during the reset stage T3; and the fifth transistor M5 is always controlled by the first power voltage written into the first power voltage terminal VDD, so that the potential at the pull-down node PD is a high level signal, the tenth transistor M10 and the eleventh transistor M11 are turned on, a low level signal written into the low level signal terminal VGL denoises the output of the pull-up node PU through the tenth transistor M10, and denoises the output of the signal output terminal Output through the eleventh transistor M11. At the same time, the eighteenth transistor M18 is turned on, and an output of the first connection node CN1 is denoised.

The shift register repeats the noise reduction stage T4 until the next frame of picture arrives, thereby denoising the shift register continually. The blank stage is between the end of the display of the frame of picture and the beginning of the next frame of picture.

Figure 10:
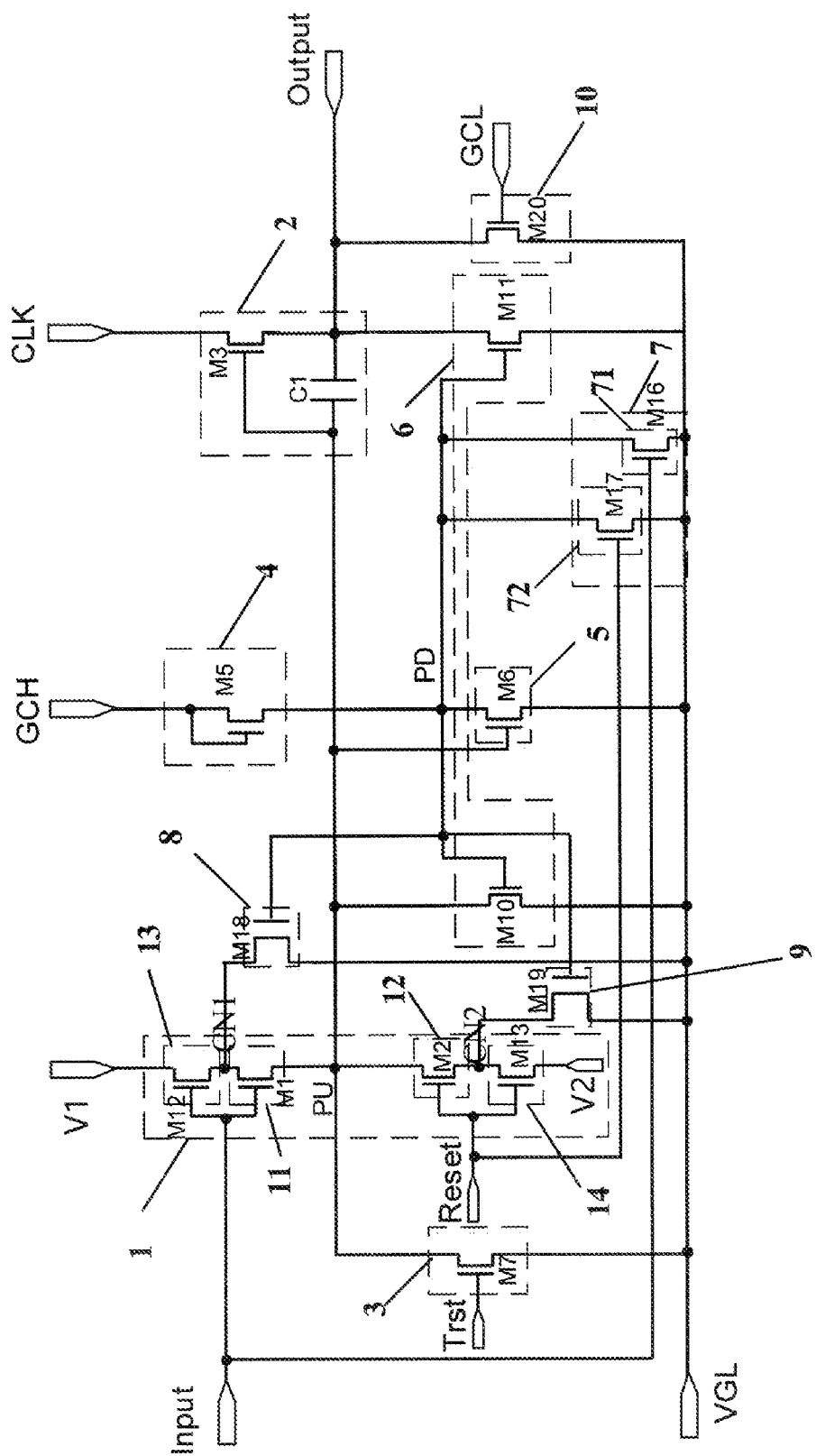
FIG. 10 is a circuit diagram of another shift register according to an embodiment of the present disclosure.

In another example, FIG. 10 is a schematic diagram of a circuit of another shift register of an embodiment of the present disclosure. As shown in FIG. 10, the shift register may implement the bidirectional scanning, and includes the input circuit 1, the output circuit 2, a frame reset circuit 3, the pull-down control circuit 4, the pull-down circuit 5, the first noise reduction circuit 6, a second noise reduction circuit 8, a third noise reduction circuit 9, a fourth noise reduction circuit 10, and the first auxiliary circuit 7. The number of each of the pull-down control circuit 4, the pull-down circuit 5, the first noise reduction circuit 6, and the first auxiliary circuit 7 is 1. The input circuit 1 includes the first input sub-circuit 11, the second output sub-circuit, a first anticreep sub-circuit 13 and a second anticreep sub-circuit 14; the first anticreep sub-circuit 13 includes a twelfth transistor M12; the second anticreep sub-circuit 14 includes a thirteenth transistor M13; the first auxiliary circuit 7 includes the first auxiliary sub-circuit 71 and the second auxiliary sub-circuit 72. The first input sub-circuit 11 includes the first transistor M1, the second input sub-circuit 12 includes the second transistor M2; the output circuit 2 includes a third transistor M3 and a storage capacitor C1; the frame reset circuit 3 includes a seventh transistor M7; the pull-down control circuit 4 includes a fifth transistor M5; the pull-down circuit 5 includes a sixth transistor M6; the first noise reduction circuit 6 includes a tenth transistor M10 and an eleventh transistor M11; the first auxiliary sub-circuit 71 includes a sixteenth transistor M16; the second auxiliary sub-circuit 72 includes a seventeenth transistor M17; the second noise reduction circuit 8 may include an eighteenth transistor M18; the third noise reduction circuit 9 may include a nineteenth transistor M19, and the fourth noise reduction circuit 10 includes a twentieth transistor M20.

With continued reference to FIG. 10, a source electrode of the first transistor M1 is connected to a first connection node CN1, a drain electrode of the first transistor M1 is connected to the pull-up node PU, and a gate electrode of the first transistor M1 is connected to the first input signal terminal Input1; a source electrode of the second transistor M2 is connected to the pull-up node PU, a drain electrode of the second transistor M2 is connected to a second connection node CN2, and a gate electrode of the second transistor M2 is connected to the second input signal terminal Input2. A source electrode of the twelfth transistor M12 is connected to the first voltage terminal, a drain electrode of the twelfth transistor M12 is connected to the first connection node CN1, and a gate electrode of the twelfth transistor M12 is connected to the first input signal terminal Input1; a source electrode of the thirteenth transistor M13 is connected to the second voltage terminal, a drain electrode of the thirteenth transistor M13 is connected to the second connection node CN2, and a gate electrode of the thirteenth transistor M13 is connected to the second input signal terminal Input2. A source electrode of the third transistor M3 is connected to a clock signal terminal CLK, a drain electrode of the third transistor M3 is connected to the signal output terminal Output, and a gate electrode of the third transistor M3 is connected to the pull-up node PU; a first plate of the storage capacitor C1 is connected to the pull-up node PU, and a second plate of the storage capacitor C1 is connected to the signal output terminal Output. A source electrode of the seventh transistor M7 is connected to the pull-up node PU, a drain electrode of the seventh transistor M7 is connected to the low level signal terminal VGL, and a gate electrode of the seventh transistor M7 is connected to the reset signal terminal Trst. Source and gate electrodes of the fifth transistor M5 are connected to the first control signal terminal, and a drain electrode of the fifth transistor M5 is connected to the pull-down node PD; a source electrode of the sixth transistor M6 is connected to the pull-down node PD, a drain electrode of the sixth transistor M6 is connected to the low level signal terminal VGL, and a gate electrode of the sixth transistor M6 is connected to the pull-up node PU. A source electrode of the tenth transistor M10 is connected to the pull-down node PU, a drain electrode of the tenth transistor M10 is connected to the low level signal terminal VGL, and a gate electrode of the tenth transistor M10 is connected to the pull-down node PD; a source electrode of the eleventh transistor M11 is connected to the signal output terminal Output, a drain electrode of the eleventh transistor M11 is connected to the low level signal terminal VGL, and a gate electrode of the eleventh transistor M11 is connected to the pull-down node PD. A source electrode of the sixteenth transistor M16 is connected to the pull-down node PD, a drain electrode of the sixteenth transistor M16 is connected to the low level signal terminal VGL, and a gate electrode of the sixteenth transistor M16 is connected to the first input signal terminal Input1. A source electrode of the seventeenth transistor M17 is connected to the pull-down node PD, a drain electrode of the seventeenth transistor M17 is connected to the low level signal terminal VGL, a gate electrode of the seventeenth transistor M17 is connected to the second input signal terminal. A source electrode of the eighteenth transistor M18 is connected to the first connection node CN1, a drain electrode of the eighteenth transistor M18 is connected to the low level signal terminal VGL, and a gate electrode of the eighteenth transistor M18 is connected to the pull-down node PD; a source electrode of the nineteenth transistor M19 is connected to the second connection node CN2, a drain electrode of the nineteenth transistor M19 is connected to the low level signal terminal VGL, and a gate electrode of the nineteenth transistor M19 is connected to the pull-down node PD. A source electrode of the twentieth transistor M20 is connected to the signal output terminal Output, a drain electrode of the twentieth transistor M20 is connected to the low level signal terminal VGL, and a gate electrode of the twentieth transistor M20 is connected to the second control signal terminal.

FIG. 2 is a timing diagram of an operation of a shift register. Referring to FIGS. 2 and 10, a driving method for the shift register includes a display stage and a blank stage for displaying one frame of picture. The blank stage includes a frame reset and output noise reduction stage T0; the display stage includes a precharge stage T1, an output stage T2, a reset stage T3 and a noise reduction stage T4.

The frame reset and output noise reduction stage T0: a high level signal is input to the reset signal terminal Trst and the second control signal terminal, so that the fourth transistor M4 and the seventh transistor M7 are turned on, and a low level signal at the low level signal terminal VGL pulls down the output of the signal output terminal Output through the fourth transistor M4, and pulls down the potential at the pull-up node PU through the seventh transistor M7, so that the noise of the signal output terminal Output and the pull-up node PU is effectively prevented from affecting the display of the next frame of picture.

The precharge stage T1: a high level signal is input to the first input signal terminal Input1, so that the first transistor M1 is turned on, and the pull-up node PU is precharged by the high level signal at the first input signal terminal Input1; and the sixteenth transistor M16 is turned on, and the potential at the pull-down node PD is pulled down by a low level signal at the level signal terminal, so that the potential at the pull-up node PU is effectively prevented from being influenced by leakage of the tenth transistor M10.

The output stage T2: a low level signal is written into the first input signal terminal Input1, so that the first transistor M1 is turned off, and the pull-up node PU keeps the high level potential of the precharge stage T1; at this time, the third transistor M3 is turned on, a high level signal is input to the clock signal terminal CLK, and the pull-up node PU is amplified due to a bootstrapping voltage of the storage capacitor C1, so as to ensure that the third transistor M3 is continuously turned on, so that the signal output terminal Output outputs a high level signal.

The reset stage T3: a reset signal (i.e., a high level signal) is written into the second input signal terminal Input2, so that the second transistor M2 and the thirteenth transistor M13 are turned on, and the potential at the pull-up node PU is pulled down and reset by a low level signal at the low level signal terminal VGL.

The noise reduction stage T4: the pull-up node PU is pulled down to the low level potential during the reset stage T3; and the fifth transistor M5 is always controlled by the first power voltage written into the first control signal terminal, so that the potential at the pull-down node PD is a high level signal, the tenth transistor M10 and the eleventh transistor M11 are turned on, a low level signal written into the low level signal terminal VGL denoises the output of the pull-up node PU through the tenth transistor M10, and denoises the output of the signal output terminal Output through the eleventh transistor M11. At the same time, the eighteenth transistor M18 is turned on, and an output of the first connection node CN1 is denoised.

The shift register repeats the noise reduction stage T4 until the next frame of picture arrives, thereby denoising the shift register continually. The blank stage is between the end of the display of the frame of picture and the beginning of the next frame of picture.

Figure 11:
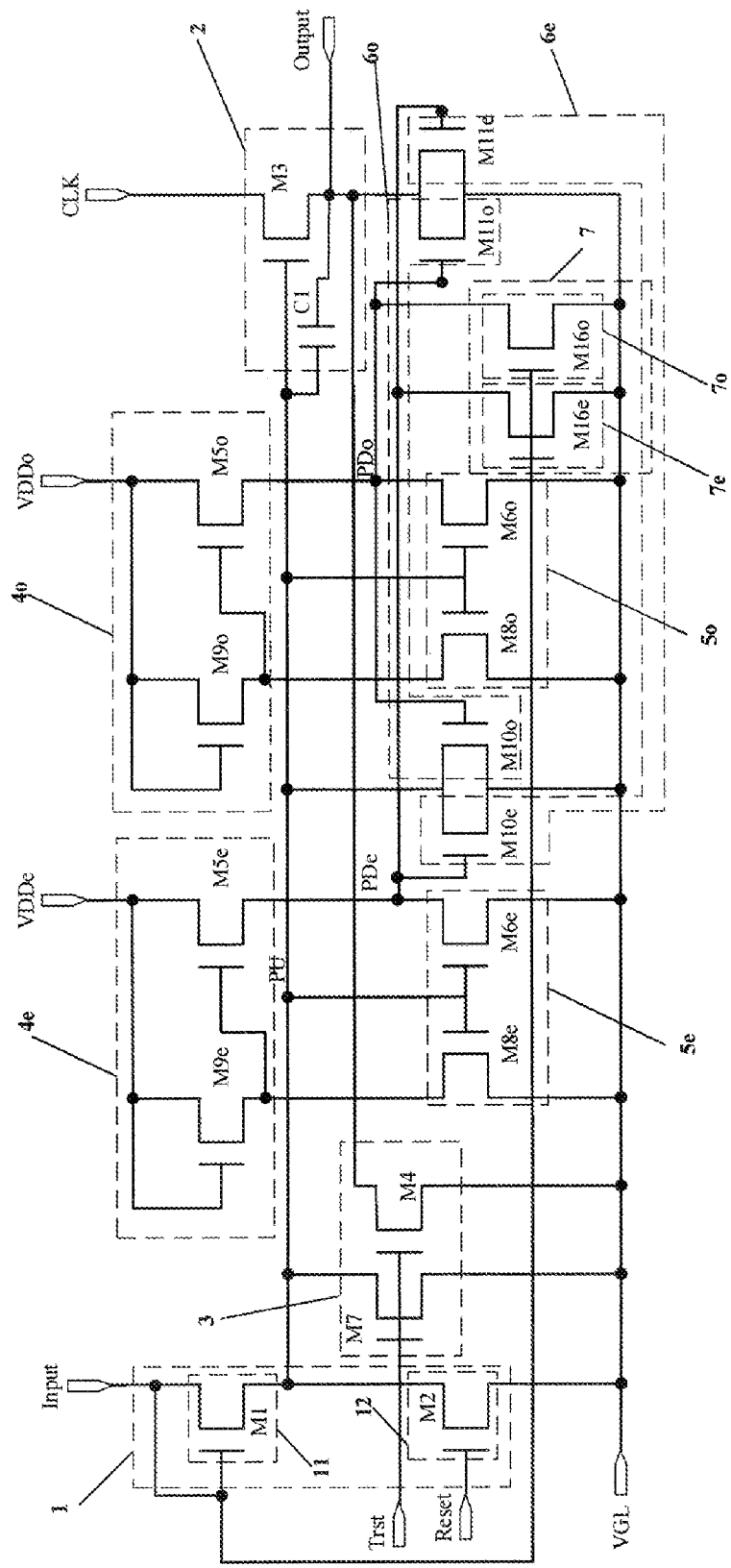
FIG. 11 is a circuit diagram of another shift register according to an embodiment of the present disclosure.

In another example, FIG. 11 is a schematic diagram of a circuit of another shift register of an embodiment of the present disclosure. As shown in FIG. 11, the shift register may implement the bidirectional scanning, and includes the input circuit 1, the output circuit 2, a frame reset circuit 3, the pull-down control circuit 4, the pull-down circuit 5, the first noise reduction circuit 6, and the first auxiliary circuit 7. The number of each of the pull-down control circuit 4, the pull-down circuit 5, the first noise reduction circuit 6 and the first auxiliary circuit 7 is 2; wherein the input circuit 1 includes the first input sub-circuit 11 and the second output sub-circuit; the first input sub-circuit 11 includes the first transistor M1, the second input sub-circuit 12 includes the second transistor M2; the output circuit 2 includes a third transistor M3 and a storage capacitor C1; the frame reset circuit 3 includes a fourth transistor M4 and a seventh transistor M7; each pull-down control circuit 4 includes a fifth transistor M5 and a ninth transistor M9, wherein the fifth transistors M5 in the 1st and 2nd pull-down control circuits 4e/4o are denoted by M5e and M5o, respectively, and the ninth transistors M9 are denoted by M9e and M9o, respectively; each pull-down circuit 5 includes a sixth transistor M6 and an eighth transistor M8, wherein the sixth transistors M6 in the 1st and 2nd pull-down circuits 5e/5o are denoted by M6e and M6o, respectively, and the eighth transistors M8 are denoted by M8e and M8o, respectively; each first noise reduction circuit 6 includes a tenth transistor M10 and an eleventh transistor M11, wherein the tenth transistors M10 in the 1st and 2nd first noise reduction circuits 6e/6o are denoted by M10e and M10o, respectively, and the eleventh transistors M11 are denoted by M11e and M11o, respectively; the first auxiliary circuit 7 includes sixteenth transistors M16, the sixteenth transistors M16 in the 1st and 2nd first auxiliary circuits 7e/7o are denoted by M16e and M16o, respectively. The first power voltage terminals VDD to which the 1st and 2nd pull-down control circuits 4 are connected are denoted by VDDe and VDDo, respectively. In addition, the 1st pull-down control circuit 4 is connected to the 1st pull-down circuit 5, and a connection node therebetween is represented by a pull-down node PDe; the 2nd pull-down control circuit 4 is connected to the 2nd pull-down circuit 5, and a connection node therebetween is represented by a pull-down node PDo; the 1st first noise reduction circuit 6 is connected to PDe, the 2nd first noise reduction circuit 6 is connected to PDo; the 1st first auxiliary circuit 7e is connected to PDe; the 2nd first auxiliary circuit 7o is connected to PDo.

With continued reference to FIG. 11, source and gate electrodes of the first transistor M1 are connected to the input signal terminal Input, and a drain electrode of the first transistor M1 is connected to the pull-up node PU; a source electrode of the second transistor M2 is connected to the pull-up node PU, a drain electrode of the second transistor M2 is connected to the low level signal terminal VGL, and a gate electrode of the second transistor M2 is connected to the reset signal terminal Reset. A source electrode of the third transistor M3 is connected to a clock signal terminal CLK, a drain electrode of the third transistor M3 is connected to the signal output terminal Output, and a gate electrode of the third transistor M3 is connected to the pull-up node PU; a first plate of the storage capacitor C1 is connected to the pull-up node PU, and a second plate of the storage capacitor C1 is connected to the signal output terminal Output. A source electrode of the fourth transistor M4 is connected to the signal output terminal Output, a drain electrode of the fourth transistor M4 is connected to the low level signal terminal VGL, and a gate electrode of the fourth transistor M4 is connected to a reset signal terminal Trst; a source electrode of the seventh transistor M7 is connected to the pull-up node PU, a drain electrode of the seventh transistor M7 is connected to the low level signal terminal VGL, and a gate electrode of the seventh transistor M7 is connected to the reset signal terminal Trst. A source electrode of the fifth transistor M5e is connected to the first power voltage terminal VDDe, a drain electrode of the fifth transistor M5e is connected to the pull-down node PDe, and a gate electrode of the fifth transistor M5e is connected to a drain electrode of the ninth transistor M9e; source and gate electrodes of the ninth transistor M9e are connected to the first power voltage terminal VDDe; a source electrode of the fifth transistor M5o is connected to the first power voltage terminal VDDo, a drain electrode of the fifth transistor M5o is connected to the pull-down node PDo, and a gate electrode of the fifth transistor M5o is connected to a drain electrode of the ninth transistor M9o; source and gate electrodes of the ninth transistor M9o are connected to the first power voltage terminal VDDo; a source electrode of the sixth transistor M6e is connected to the pull-down node PDe, a drain electrode of the sixth transistor M6e is connected to the low level signal terminal VGL, and a gate electrode of the sixth transistor M6e is connected to the pull-up node PU; a source electrode of the eighth transistor M8e is connected to the drain electrode of the ninth transistor M9e and the gate electrode of the fifth transistor M5e, a drain electrode of the eighth transistor M8e is connected to the low level signal terminal VGL, and a gate electrode of the eighth transistor M8e is connected to the pull-up node PU; a source electrode of the sixth transistor M6o is connected to the pull-down node PDo, a drain electrode of the sixth transistor M6o is connected to the low level signal terminal VGL, and a gate electrode of the sixth transistor M6o is connected to the pull-up node PU. A source electrode of the eighth transistor M8o is connected to the drain electrode of the ninth transistor M9o and the gate electrode of the fifth transistor M5o, a drain electrode of the eighth transistor M8o is connected to the low level signal terminal VGL, and a gate electrode of the eighth transistor M8o is connected to the pull-up node PU; a source electrode of the tenth transistor M10e is connected to the pull-down node PU, a drain electrode of the tenth transistor M10e is connected to the low level signal terminal VGL, and a gate electrode of the tenth transistor M10e is connected to the pull-down node PDe; a source electrode of the eleventh transistor M11e is connected to the signal output terminal Output, a drain electrode of the eleventh transistor M11e is connected to the low level signal terminal VGL, and a gate electrode of the eleventh transistor M11e is connected to the pull-down node PDe; a source electrode of the tenth transistor M10o is connected to the pull-down node PU, a drain electrode of the tenth transistor M10o is connected to the low level signal terminal VGL, and a gate electrode of the tenth transistor M10o is connected to the pull-down node PDo; a source electrode of the eleventh transistor M11o is connected to the signal output terminal Output, a drain electrode of the eleventh transistor M11o is connected to the low level signal terminal VGL, and a gate electrode of the eleventh transistor M11o is connected to the pull-down node Pdo. A source electrode of the sixteenth transistor M16e is connected to the pull-down node PDe, a drain electrode of the sixteenth transistor M16e is connected to the low level signal terminal VGL, and a gate electrode of the sixteenth transistor M16e is connected to the first input signal terminal Input1; a source electrode of the sixteenth transistor M16o is connected to the pull-down node PDo, a drain electrode of the sixteenth transistor M16o is connected to the low level signal terminal VGL, and a gate electrode of the sixteenth transistor M16o is connected to the first input signal terminal Input1. A source electrode of the seventeenth transistor M17e is connected to the pull-down node PDe, a drain electrode of the seventeenth transistor M17e is connected to the low level signal terminal VGL, a gate electrode of the seventeenth transistor M17e is connected to the second input signal terminal. A source electrode of the seventeenth transistor M17o is connected to the pull-down node PDo, a drain electrode of the seventeenth transistor M17o is connected to the low level signal terminal VGL, and a gate electrode of the seventeenth transistor M17o is connected to the second input signal terminal.

It should be noted that in the scanning process of one frame of picture, the 1st pull-down control circuit 4, the 1st first pull-down circuit 5, the 1st first noise reduction circuit 6, the 1st first auxiliary sub-circuit 71, and the 1st second auxiliary sub-circuit 72 operate, or the 2nd pull-down control circuit 4, the 2nd first pull-down circuit 5, the 2nd first noise reduction circuit 6, the 2nd first auxiliary sub-circuit 7 operate. That is, for each of the pull-down control circuits 4 (which are the same functional circuit), the pull-down circuits 5 (which are the same functional circuit), the first noise reduction circuits 6 (which are the same functional circuit), and the first auxiliary circuits 7 (which are the same functional circuit), only one of the same functional circuits operates when scanning one frame of picture, and when the operation is preset, it may be switched to a case where the other one of the same functional circuits operates, so that the life of the shift register may be prolonged. In the following description, only the 1st pull-down control circuit 4, the 1st first pull-down circuit 5, the 1st first noise reduction circuit 6, the 1st first auxiliary sub-circuit 7 operate, as an example.

FIG. 2 is a timing diagram of an operation of a shift register. Referring to FIGS. 2 and 11, a driving method for the shift register includes a display stage and a blank stage for displaying one frame of picture. The blank stage includes a frame reset stage T0; the display stage includes a precharge stage T1, an output stage T2, a reset stage T3 and a noise reduction stage T4.

The frame reset stage T0: a high level signal is input to the reset signal terminal Trst, so that the fourth transistor M4 and the seventh transistor M7 are turned on, and a low level signal at the low level signal terminal VGL pulls down the output of the signal output terminal Output through the fourth transistor M4, and pulls down the potential at the pull-up node PU through the seventh transistor M7, so that the noise of the signal output terminal Output and the pull-up node PU is effectively prevented from affecting the display of the next frame of picture.

The precharge stage T1: a high level signal is input to the input signal terminal Input, so that the first transistor M1 is turned on, and the pull-up node PU is precharged by the high level signal at the first input signal terminal Input1; and the sixteenth transistor is turned on, and the potential at the pull-down node PDe is pulled down by a low level signal at the level signal terminal, so that the potential at the pull-up node PU is effectively prevented from being influenced by leakage of the tenth transistor M10e.

The output stage T2: a low level signal is written into the input signal terminal Input, so that the first transistor M1 is turned off, and the pull-up node PU keeps the high level potential of the precharge stage T1; at this time, the third transistor M3 is turned on, a high level signal is input to the clock signal terminal CLK, and the pull-up node PU is amplified due to a bootstrapping voltage of the storage capacitor C1, so as to ensure that the third transistor M3 is continuously turned on, so that the signal output terminal Output outputs a high level signal.

The reset stage T3: a reset signal (i.e., a high level signal) is written into the reset signal terminal Reset, so that the second transistor M2 is turned on, and the potential at the pull-up node PU is pulled down and reset by a low level signal at the low level signal terminal VGL.

The noise reduction stage T4: the pull-up node PU is pulled down to the low level potential during the reset stage T3; and the fifth transistor M5e and the ninth transistor M9e are always controlled by the first power voltage written into the first power voltage terminal VDDe, so that the potential at the pull-down node PDe is a high level signal, the tenth transistor M10e and the eleventh transistor M11e are turned on, a low level signal written into the low level signal terminal VGL denoises the output of the pull-up node PU through the tenth transistor M10e, and denoises the output of the signal output terminal Output through the eleventh transistor M11e.

The shift register repeats the noise reduction stage T4 until the next frame of picture arrives, thereby denoising the shift register continually. The blank stage is between the end of the display of the frame of picture and the beginning of the next frame of picture.

Ranges of width to length ratios of transistors and the storage capacitor C1 in each shift register in the embodiment of the present disclosure will be shown below, as shown in Table 1. Width to length ratios of M1 and M12 may be the same or substantially the same; width to length ratios of M2 and M13 may be the same or substantially the same; width to length ratios of M5, M5e, M5o may be the same or substantially the same; width to length ratios of M9, M9e, M9o may be the same or substantially the same; width to length ratios of M6, M6e, M6o may be the same or substantially the same; width to length ratios of M8, M8e, M8o may be the same or substantially the same; width to length ratios of M10, M10e, M10o may be the same or substantially the same; width to length ratios of M11, M11e, M11o may be the same or substantially the same; width to length ratios of M16, M16e, M16o, M17e, M17o, M18e, M18o, M9e, and M9o may be the same or substantially the same.

TABLE 1

| ITEM | Width to length ratio (μm) |
| --- | --- |
| M1 | 100/1 to 200/1 |
| M2 | 20/1 to 100/1 |
| M3 | 800// to 1500/1 |
| M4 | 10/1 to 20/1 |
| M5 | 2/1 to 20/1 |
| M6 | 10/1 to 100/1 |
| M7 | 10/1 to 20/1 |
| M8 | 5/1 to 10/1 |
| M9 | 2/1 to 8/1 |
| M10 | 80/1 to 150/1 |
| M11 | 80/1 to 150/1 |
| M16 | 10/1 to 30/1 |
| C1 | 1 to 6 |

Figure 12:
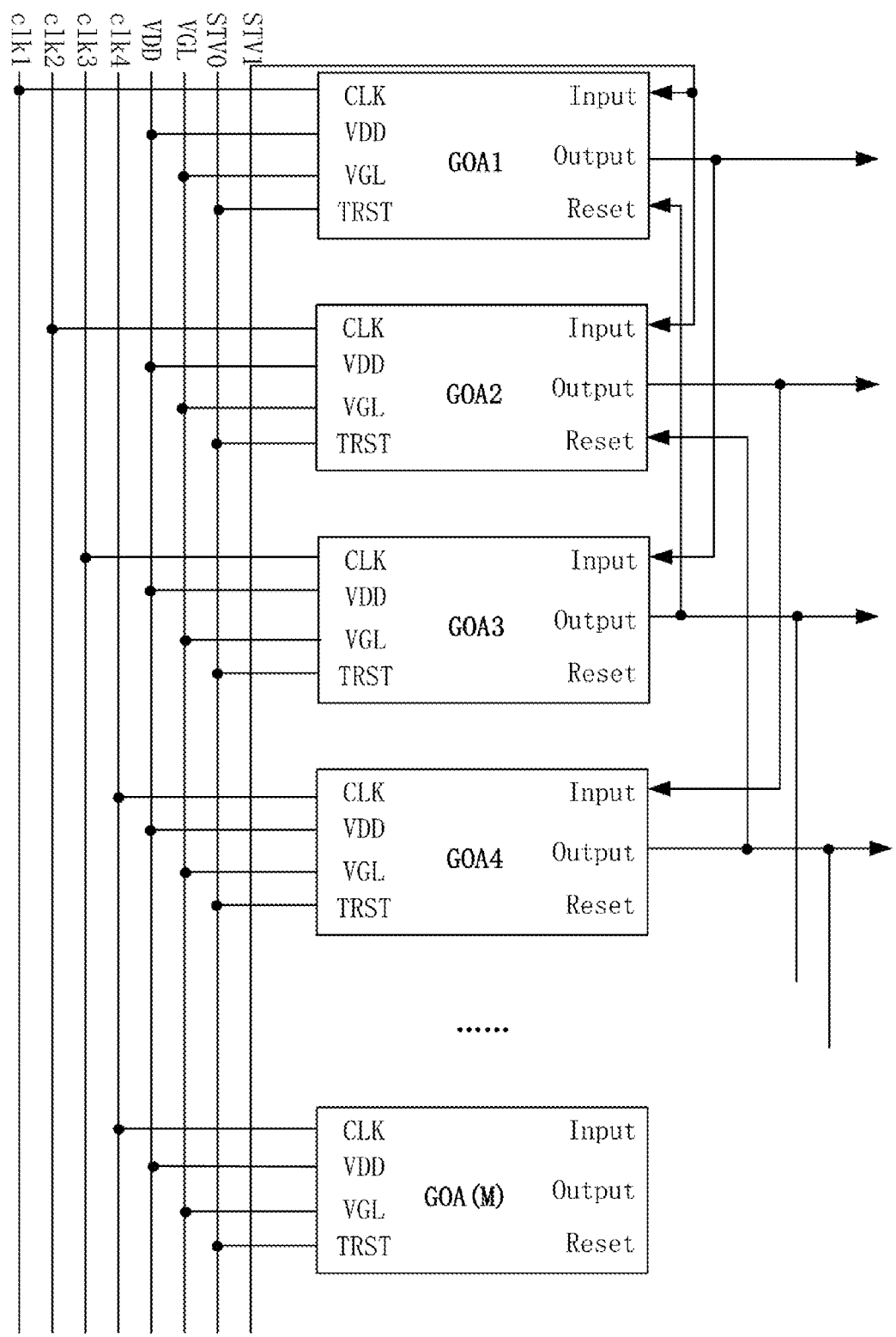
FIG. 12 is a schematic diagram of cascading of a gate driving circuit according to an embodiment of the present disclosure.

In a second aspect, FIG. 12 is a schematic diagram of cascading of a gate driving circuit according to an embodiment of the present disclosure. As shown in FIG. 12, an embodiment of the present disclosure provides a gate driving circuit, which includes a plurality of shift registers which are cascaded, and each of the plurality of shift registers is any of the above shift registers.

With reference to FIG. 12, the gate driving circuit uses 4 clock signal lines, where the first input signal terminal Input1 is the input signal terminal Input, and the second signal input terminal is the reset signal terminal Reset. The 4 clock signal lines are clk1, clk2, clk3 and clk4, respectively; if the gate driving circuit includes M shift registers; the signal output terminal Output of the Nth-stage shift register is connected to the input signal terminal Input of the (N+2)th-stage shift register; the reset signal terminal Reset of the Nth-stage shift register is connected to the signal output terminal Output of the (N+2)th-stage shift register; N is any one of 1 to M. In addition, the signal input terminals of the first-stage shift register and the second-stage shift register are connected to a frame starting signal line STV1; reset signal terminals Trst of the shift registers are connected to the same frame reset signal line STV0.

It should be noted that the shift register of the first stage and the shift register of the last stage are interchangeable, which depends on the forward scanning and the reverse scanning for the gate driving circuit. During the forward scanning for gate lines in the gate driving circuit, according to the scanning sequence for gate lines, a shift register unit providing a scanning signal for the first gate line is the first shift register; a shift register unit providing a scanning signal for the last gate line is the last shift register. During the reverse scanning for gate lines in the gate driving circuit, according to the scanning sequence for gate lines, a scanning signal is firstly input into the last gate line, so that a shift register unit providing a scanning signal for the last gate line is the first shift register; a shift register unit providing a scanning signal for the first gate line is the last shift register. Meanwhile, the interchanging of the forward scanning and the reverse scanning is implemented only by exchanging signals input to the first power voltage terminal VDD and the second power voltage terminal, exchanging signals input to the signal input terminal and the reset signal terminal Reset.

In a third aspect, an embodiment of the present disclosure provides a display panel, which includes the above gate driving circuit. The above gate driving circuit is included, so that the display panel has a better display effect and may realize a narrow-bezel design.

The display device may be any product or component with a display function, such as a mobile phone, a tablet computer, a television, a display, a notebook computer, a digital photo frame, a navigator and the like.

Alternatively, the display device of the present embodiment may further include other conventional structures, such as a power supply unit, a display driving unit, and the like.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A shift register, comprising: an input circuit, an output circuit, at least one pull-down control circuit, at least one pull-down circuit, at least one first auxiliary circuit and at least one first noise reduction circuit; wherein,
 the input circuit is configured to precharge and reset a pull-up node; the input circuit, the pull-down circuit and the output circuit are connected to the pull-up node as a connection node;
 one of the at least one pull-down control circuit is electrically connected to one of the at least one pull-down circuit through one of at least one pull-down node; the at least one pull-down control circuit is configured to control at least one potential at the at least one pull-down node under the control of a first power voltage, respectively;
 each of the at least one pull-down circuit is configured to pull down the at least one potential at the at least one pull-down node in response to a potential at the pull-up node;
 the output circuit is configured to output a clock signal through a signal output terminal in response to the potential at the pull-up node;
 one of the at least one first noise reduction circuit is connected to one of the at least one pull-down node; the at least one first noise reduction circuit is configured to denoise the pull-up node and an output of the signal output terminal by a non-operating level signal in response to the at least one pull-down node; and
 one of the at least one first auxiliary circuit is electrically connected to one pull-down node; the at least one first auxiliary circuit is configured to pull down a potential at the pull-down node by a non-operating level signal in a precharge stage in response to an input signal.

2. The shift register of claim 1, wherein the input circuit comprises a first input sub-circuit and a second input sub-circuit;
 the first input sub-circuit is configured to charge the pull-up node by a first voltage in response to a first input signal in a forward scanning, and reset the pull-up node by a second voltage in response to a second input signal in a reverse scanning; and
 the second input sub-circuit is configured to reset the pull-up node by the second voltage in response to the second input signal in the forward scanning, and charge the pull-up node by the first voltage in response to the first input signal in the reverse scanning.

3. The shift register of claim 2, wherein the first input sub-circuit comprises a first transistor; the second input sub-circuit comprises a second transistor;
 a first electrode of the first transistor is connected to a first voltage terminal, a second electrode of the first transistor is connected to the pull-up node, and a control electrode of the first transistor is connected to a first input signal terminal; and
 a first electrode of the second transistor is connected to a second voltage terminal, a second electrode of the second transistor is connected to the pull-up node, and a control electrode of the second transistor is connected to a second input signal terminal.

4. The shift register of claim 2, wherein the input circuit further comprises a first anticreep sub-circuit and a second anticreep sub-circuit;
 the first anticreep sub-circuit is configured to prevent the first input sub-circuit from leaking electricity to affect the potential at the pull-up node in the forward scanning; and
 the second anticreep sub-circuit is configured to prevent the second input sub-circuit from leaking electricity to affect the potential at the pull-up node in the reverse scanning.

5. The shift register of claim 4, wherein the first anticreep sub-circuit comprises a twelfth transistor; the second anticreep sub-circuit comprises a thirteenth transistor;
 a first electrode of the twelfth transistor is connected to the first voltage terminal, a second electrode of the twelfth transistor is connected to the first input sub-circuit, and a control electrode of the twelfth transistor is connected to the first input signal terminal; and
 a first electrode of the thirteenth transistor is connected to the second voltage terminal, a second electrode of the thirteenth transistor is connected to the second input sub-circuit, and a control electrode of the thirteenth transistor is connected to the second input signal terminal.

6. The shift register of claim 4, further comprising at least one second noise reduction circuit and at least one third noise reduction circuit;
 one of the at least one second noise reduction circuit is connected to one of the at least one pull-down node and is configured to denoise an output of the first anticreep sub-circuit in response to a potential at the pull-down node; and one of the at least one third noise reduction circuit is connected to one of the at least one pull-down node and is configured to denoise an output of the second anticreep sub-circuit in response to a potential at the pull-down node.

7. The shift register of claim 6, wherein the second noise reduction circuit comprises an eighteenth transistor; the third noise reduction circuit comprises a nineteenth transistor;
a first electrode of the eighteenth transistor is connected between the first input sub-circuit and the first anticreep sub-circuit, a second electrode of the eighteenth transistor is connected to a non-operating level terminal, and a control electrode of the eighteenth transistor is connected to a corresponding pull-down node; and
a first electrode of the nineteenth transistor is connected between the second input sub-circuit and the second anticreep sub-circuit, a second electrode of the nineteenth transistor is connected to the non-operating level terminal, and a control electrode of the nineteenth transistor are connected to a corresponding pull-down node.

8. The shift register of claim 2, wherein each of the at least one first auxiliary circuit comprises a first auxiliary sub-circuit and a second auxiliary sub-circuit;
the first auxiliary sub-circuit is configured to pull down the potential at the pull-down node by the non-operating level signal in response to the first input signal in the forward scanning; and
the second auxiliary sub-circuit is configured to pull down the potential at the pull-down node by the non-operating level signal in response to the first input signal in the reverse scanning.

9. The shift register of claim 8, wherein the first auxiliary sub-circuit comprises a sixteenth transistor; the second auxiliary sub-circuit comprises a seventeenth transistor;
a first electrode of the sixteenth transistor is connected to a corresponding pull-down node, a second electrode of the sixteenth transistor is connected to the non-operating level terminal, and a control electrode of the sixteenth transistor is connected to a first input signal terminal; and
a first electrode of the seventeenth transistor is connected to a corresponding pull-down node, a second electrode of the seventeenth transistor is connected to the non-operating level terminal, and a control electrode of the seventeenth transistor is connected to a second input signal terminal.

10. The shift register of claim 1, further comprising a frame reset circuit configured to reset the potential at the pull-up node and the potential at the signal output terminal by the non-operating level signal in response to the reset signal in a blank stage.

11. The shift register of claim 10, wherein the frame reset circuit comprises a fourth transistor and a seventh transistor;
a first electrode of the fourth transistor is connected to the signal output terminal, a second electrode of the fourth transistor is connected to a non-operating level terminal, and a control electrode of the fourth transistor is connected to the reset signal terminal; and
a first electrode of the seventh transistor is connected to the pull-up node, a second electrode of the seventh transistor is connected to an operating level terminal, and a control electrode of the seventh transistor is connected to the reset signal terminal.

12. The shift register of claim 1, wherein each of the at least one first noise reduction circuit comprises a tenth transistor and an eleventh transistor;
a first electrode of the tenth transistor is connected to the pull-up node, a second electrode of the tenth transistor is connected to a non-operating level terminal, and a control electrode of the tenth transistor is connected to the pull-down node; and
a first electrode of the eleventh transistor is connected to the pull-up node, a second electrode of the eleventh transistor is connected to the signal output terminal, and a control electrode of the eleventh transistor is connected to the pull-down node.

13. The shift register of claim 1, wherein each of the at least one pull-down control circuit comprises a fifth transistor and a ninth transistor; each of the at least one pull-down circuit comprises a sixth transistor and an eighth transistor;
a first electrode of the fifth transistor is connected to a first power voltage terminal, a second electrode of the fifth transistor is connected to the pull-down node, and a control electrode of the fifth transistor is connected to a second electrode of the ninth transistor; a first electrode and a control electrode of the ninth transistor are connected to the first power voltage terminal; and
a first electrode of the sixth transistor is connected to the pull-down node, a second electrode of the sixth transistor is connected to a non-operating level terminal, and a control electrode of the sixth transistor is connected to the pull-down node; and a first electrode of the eighth transistor is connected to the second electrode of the ninth transistor and the control electrode of the fifth transistor, a second electrode of the eighth transistor is connected to the non-operating level terminal, and a control electrode of the eighth transistor is connected to the pull-up node.

14. The shift register of claim 1, wherein each of the at least one pull-down control circuit comprises a fifth transistor; each of the at least one pull-down circuit comprises a sixth transistor;
a first electrode and a control electrode of the fifth transistor are connected to a first control signal terminal, a second electrode of the fifth transistor is connected to the pull-down node, and the first control signal terminal is configured to write a first power voltage into the control electrode of the fifth transistor in a display stage and write the non-operating level signal into the control electrode of the fifth transistor in a blank stage; and
a first electrode of the sixth transistor is connected to the pull-down node, a second electrode of the sixth transistor is connected to a non-operating level terminal, and a control electrode of the sixth transistor is connected to the pull-up node.

15. The shift register of claim 14, further comprising a fourth noise reduction circuit configured to denoise an output of the signal output terminal by the non-operating level signal in response to a second control signal in the blank stage;
wherein the fourth noise reduction circuit comprises a twentieth transistor; and
a first electrode of the twentieth transistor is connected to the signal output terminal, a second electrode of the twentieth transistor is connected to the non-operating level terminal, and a control electrode of the twentieth transistor is connected to the second control signal terminal.

16. The shift register of claim 1, wherein the input circuit comprises an input sub-circuit and a reset sub-circuit;

the input sub-circuit is configured to precharge the pull-up node by the input signal in response to the input signal; and the reset sub-circuit is configured to reset the pull-up node by the non-operating level signal in response to a reset signal.

17. The shift register of claim 16, wherein the input sub-circuit comprises a first transistor, the reset sub-circuit comprises a second transistor;
- a first electrode and a control electrode of the first transistor are connected to the signal input terminal, and a second electrode of the first transistor is connected to the pull-up node; and
- a first electrode of the second transistor is connected to the pull-up node, a second electrode of the second transistor is connected to a non-operating level signal terminal, and a control electrode of the second transistor is connected to the reset signal terminal.

18. The shift register of claim 1, wherein the output circuit comprises a third transistor and a storage capacitor;
- a first electrode of the third transistor is connected to a clock signal terminal, a second electrode of the third transistor is connected to the signal output terminal, and a control electrode of the third transistor is connected to the pull-up node; and
- a first plate of the storage capacitor is connected to the pull-up node, and a second plate of the storage capacitor is connected to the signal output terminal.

19. A gate driving circuit, comprising a plurality of shift registers which are cascaded; wherein each of the plurality of shift registers comprises the shift register of claim 1.

20. A display panel, comprising the gate driving circuit of claim 19.

* * * * *